(12) United States Patent
Wingfield et al.

(10) Patent No.: US 11,544,419 B1
(45) Date of Patent: Jan. 3, 2023

(54) SUBSAMPLING METHOD FOR CONVERTING 3D SCAN DATA OF AN OBJECT FOR MARINE, CIVIL, AND ARCHITECTURAL WORKS INTO SMALLER DENSITIES FOR PROCESSING WITHOUT CAD PROCESSING

(71) Applicant: POINTLAB, INC., Winter Springs, FL (US)

(72) Inventors: Evan Wingfield, Deerfield Beach, FL (US); Sophia Simpkins, Greer, SC (US); Kevin P. Monahan, Fort Lauderdale, FL (US); Michael T. Monahan, Winter Spings, FL (US)

( * ) Notice: Subject to any disclaimer, the term of this patent is extended or adjusted under 35 U.S.C. 154(b) by 0 days.

(21) Appl. No.: 17/872,880

(22) Filed: Jul. 25, 2022

Related U.S. Application Data

(60) Provisional application No. 63/225,699, filed on Jul. 26, 2021.

(51) Int. Cl.
| | |
|---|---|
| *G06T 3/40* | (2006.01) |
| *G06F 30/12* | (2020.01) |
| *G06F 30/13* | (2020.01) |

(52) U.S. Cl.
CPC .............. *G06F 30/12* (2020.01); *G06F 30/13* (2020.01); *G06T 3/40* (2013.01)

(58) Field of Classification Search
None
See application file for complete search history.

(56) References Cited

U.S. PATENT DOCUMENTS

| | | |
|---|---|---|
| 7,215,810 B2 | 5/2007 | Kaufmann et al. |
| 7,373,473 B2 | 5/2008 | Bukowski et al. |
| 7,420,555 B1 | 9/2008 | Lee |
| 7,804,498 B1 | 9/2010 | Graham et al. |

(Continued)

FOREIGN PATENT DOCUMENTS

GB          2537413          10/2016

OTHER PUBLICATIONS

Rixio Morales, Yunhung Wang, and Zhaoxiang Zhang, "Unstructured Point Cloud Surface Denoising and Decimation Using Distance RBF K-Nearest Neighbor Kernel" Advances in Multimedia Information Processing—PCM 2010, 2010, vol. 6298. Available at https://link.springer.com/chapter/10.1007/978-3-642-15696-0_20.

(Continued)

*Primary Examiner* — Peter Hoang
(74) *Attorney, Agent, or Firm* — Robert C. Cain; The Concept Law Group, P.A.

(57) ABSTRACT

The point cloud scan image data first is structured with a x-y-z coordinate system, then split into smaller Cluster Bounds (CB) volumes and a CB x-y-z is imposed on the CB centroid. The Euclidean x-y-z distance (ED) is calculated for each data point. Only points within Radial Distance (RD cylinder) are retained/processed. Data points within RD are weighted; points closer to centroid having higher weights. Each data point has Weighted Value WV (square of the inverse of the x-y-z distance). Each x, y, z has Weighted Average (WAV) per axes. WAV is sum of each original point coordinate times WV, divided by sum all WVs. Resultant is one subsampled point per axis. One WAV per CB is selected based upon axis nearly orthogonal to x, y, z WAV points. All CBs subsampled in parallel. Subsampled output comma separated coordinate file for CAD program.

20 Claims, 13 Drawing Sheets

(56) References Cited

U.S. PATENT DOCUMENTS

| | | | |
|---|---|---|---|
| 7,925,109 | B2 | 4/2011 | Chang et al. |
| 7,925,110 | B2 | 4/2011 | Chang et al. |
| 8,204,313 | B2 | 6/2012 | Wheeler et al. |
| 8,896,598 | B2 | 11/2014 | Collin et al. |
| 9,300,841 | B2 | 3/2016 | Askan |
| 9,317,965 | B2 | 4/2016 | Krishnaswamy et al. |
| 9,396,545 | B2 | 7/2016 | Fu et al. |
| 9,412,040 | B2 | 8/2016 | Feng et al. |
| 9,443,297 | B2 | 9/2016 | Beaudoin |
| 9,530,225 | B1 | 12/2016 | Nieves |
| 9,625,253 | B2 | 4/2017 | Stewart et al. |
| 9,633,483 | B1 | 4/2017 | Xu et al. |
| 9,734,595 | B2 | 8/2017 | Lukac et al. |
| 9,830,686 | B2 | 11/2017 | Wu et al. |
| 9,972,067 | B2 | 5/2018 | Kwon et al. |
| 9,972,129 | B2 | 5/2018 | Michel et al. |
| 10,019,649 | B2 | 7/2018 | Curington et al. |
| 10,186,080 | B2 | 1/2019 | Skrobanski |
| 10,268,917 | B2 | 4/2019 | Peolman et al. |
| 10,319,080 | B2 | 6/2019 | Kim et al. |
| 10,386,464 | B2 | 8/2019 | Dussan |
| 10,482,196 | B2 | 11/2019 | Eckart et al. |
| 10,552,989 | B2 | 2/2020 | Li et al. |
| 10,659,816 | B2 | 5/2020 | Mammou et al. |
| 10,694,210 | B2 | 6/2020 | Chou et al. |
| 10,699,444 | B2 | 6/2020 | Mammou et al. |
| 10,803,561 | B2 | 10/2020 | Ponto et al. |
| 10,853,973 | B2 | 12/2020 | Tourapis et al. |
| 10,861,196 | B2 | 12/2020 | Mammou et al. |
| 10,897,269 | B2 | 1/2021 | Mammou et al. |
| 10,909,725 | B2 | 2/2021 | Mammou et al. |
| 2014/0192050 | A1 | 7/2014 | Qiu et al. |
| 2017/0214943 | A1 | 7/2017 | Cohen et al. |
| 2018/0075643 | A1 | 3/2018 | Sequeira et al. |
| 2018/0365889 | A1 | 12/2018 | Bisson et al. |
| 2019/0108639 | A1 | 4/2019 | Tchapmi et al. |
| 2020/0005535 | A1 | 1/2020 | Glaser et al. |
| 2020/0327646 | A1 | 10/2020 | Xu et al. |

OTHER PUBLICATIONS

Enrico Gobbetti and Fabbio Marton, "Layered Point Clouds: a Simple and Efficient Multiresolution Structure for Distributing and Rendering Gigantic Point-Sampled Models" 2004, CRS4 Visual Computing Group, POLARIS Edificio 1, 09010 Pula (CA), Italy (attached).

Abdelaaziz Mahdaoui and El Hassan Sbai, "3D Point Cloud Simplification Based on k-Nearest Neighbor and Clustering" Advances in Multimedia, vol. 2020, Article ID 8825205, 10 pages, 2020. Available at https://doi.org/10.1155/2020/8825205.

Carten Moenning & Neil Anthony Dodgson, "Intrinsic Point Cloud Simplification," 2004. Available at https://www.researchgate.net/publication/225075867_Intrinsic_point_cloud_simplification.

M. Pauly, M. Gross, L.P. Kobbelt, "Efficient simplification of point-sampled surfaces". IEEE Visualization, 2002. VIS 2002., 2002, pp. 163-170, doi: 10.1109/VISUAL.2002.1183771. Available at https://ieeexplore.ieee.org/document/1183771.

Aijazi, Ahmad & Checchin, Paul & Trassoudaine, Laurent (2013). "Segmentation Based Classification of 3D Urban Point Clouds: A Super-Voxel Based Approach with Evaluation". Remote Sensing, vol. 5, issue 4, pp. 1624-1650. 5. 1624-1650. 10.3390/rs5041624. Available at https://www.researchgate.net/publication/258811391_Segmentation_Based_Classification_of_3D_Urban_Point_Clouds_A_SuperVoxel_Based_Approach_with_Evaluation.

Sunil Arya, David M. Mount, Nathan S. Netanyahu, Ruth Silverman & Angela Y. Wu "An Optimal Algorithm for Approximate Nearest Neighbor Searching in Fixed Dimensions" 1999, Journal of the ACM, vol. 45, No. 6, Nov. 1998, pp. 891-923. (Attached).

Oosterom, Peter & Martinez Rubi, Oscar & Ivanova, Milena & Horhammer, Mike & Geringer, Daniel & Ravada, Siva & Tijssen, Theo & Kodde, Martin & Goncalves, Romulo. (2015). "Massive point cloud data management: Design, implementation and execution of a point cloud benchmark". Computers & Graphics. 49. 10.1016/j.cag.2015.01.007 Available at https://www.researchgate.net/publication/272373258_Massive_point_cloud_data_management_Design_implementation_and_execution_of_a_point_cloud_benchmark.

Zhang, Kun and Qiao, Shiquan and Wang, Xiaohong and Yang, Yongtao and Zhang, Yongqiang, "Feature-Preserved Point Cloud Simplification Based on Natural Quadric Shape Models" Journal-Applied Sciences, vol. 9 No. 9 (2019) Article No. 2130. Available at https://www.mdpi.com/2076-3417/9/10/2130.

David H Douglas & Thomas K Peucker, "Algorithms for the Reduction of the Number of Points Required to Represent a Digitized Line or its Caricatur" vol. 10 Issue 2, Dec. 1973, pp. 112-122 Available at https://doi.org/10.3138/FM57-6770-U75U-7727.

J. Elseberg, D. Borrmann, A. Nüchter, "One billion points in the cloud—an octree for efficient processing of 3D laser scans." Isprs Journal of Photogrammetry and Remote Sensing 76 (2013): 76-88. Available at https://www.semanticscholar.org/paper/One-billion-points-in-the-cloud-%E2%80%93-an-octree-for-of-Elseberg-Borrmann/bad71db5c31bf02d536b52f8d069db712d5c8566.

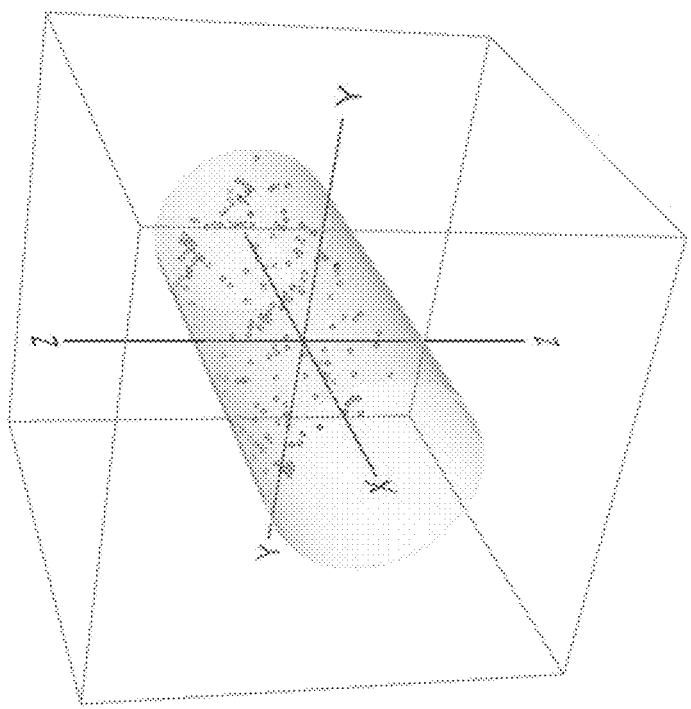
FIG. 2A - X-Axis Sampling Cylinder
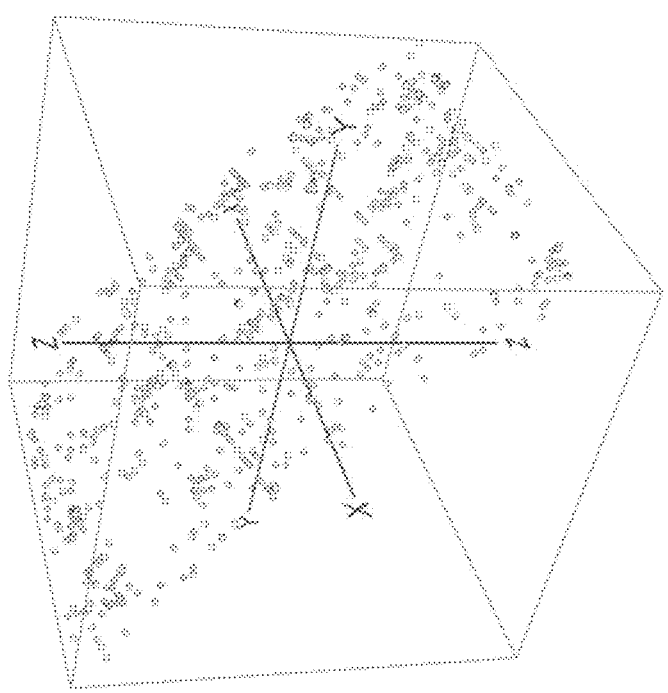
FIG. 1 – Cluster Bound (CB) Boundaries

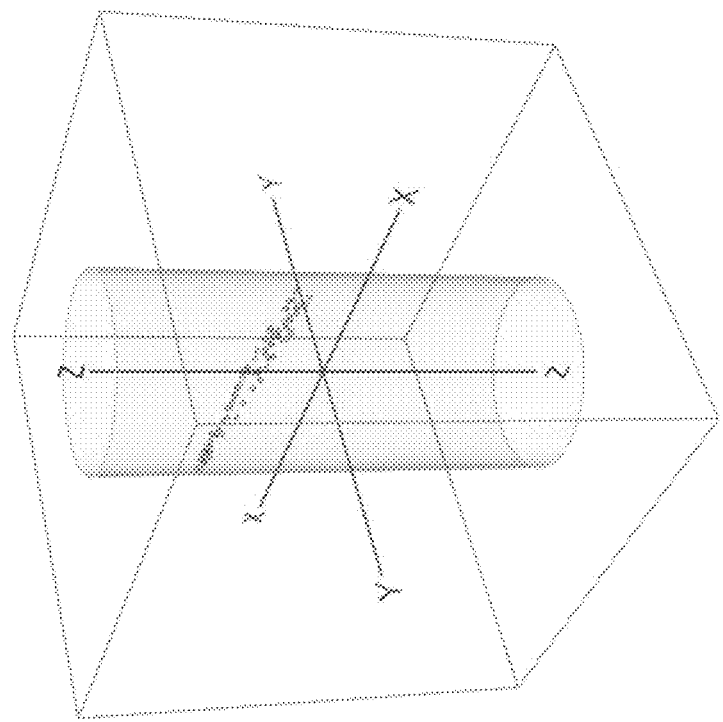
FIG. 2C – Z-Axis Sampling Cylinder
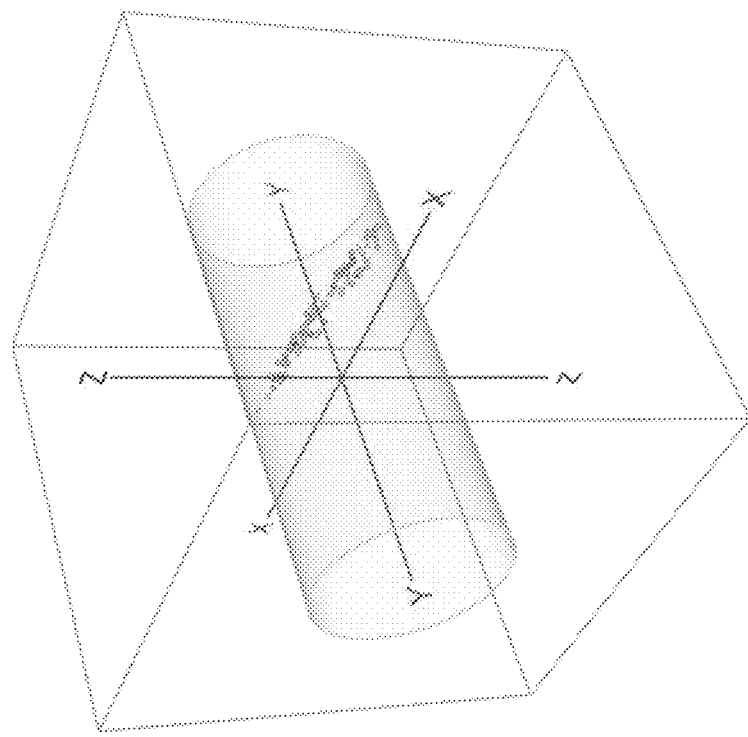
FIG. 2B – Y-Axis Sampling Cylinder

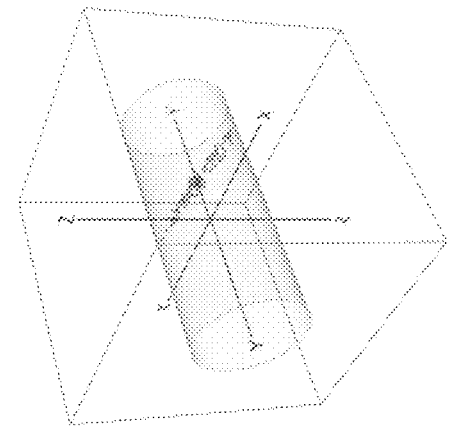
FIG. 3A – X-Axis Weighted Average Point
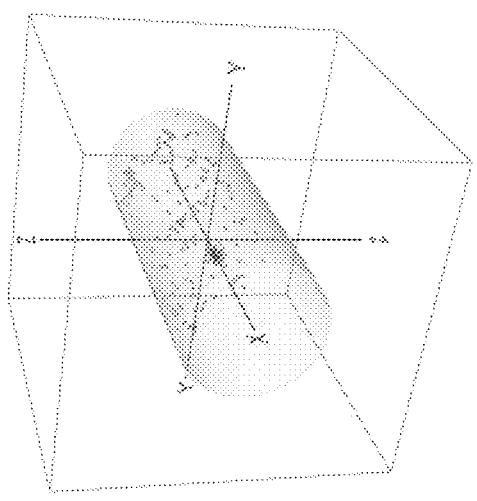
FIG. 3B – Y-Axis Weighted Ave Point
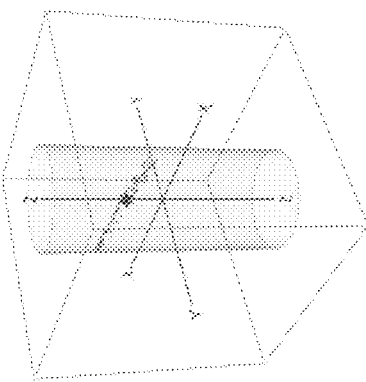
FIG. 3C – Z-Axis Weighted Ave Point

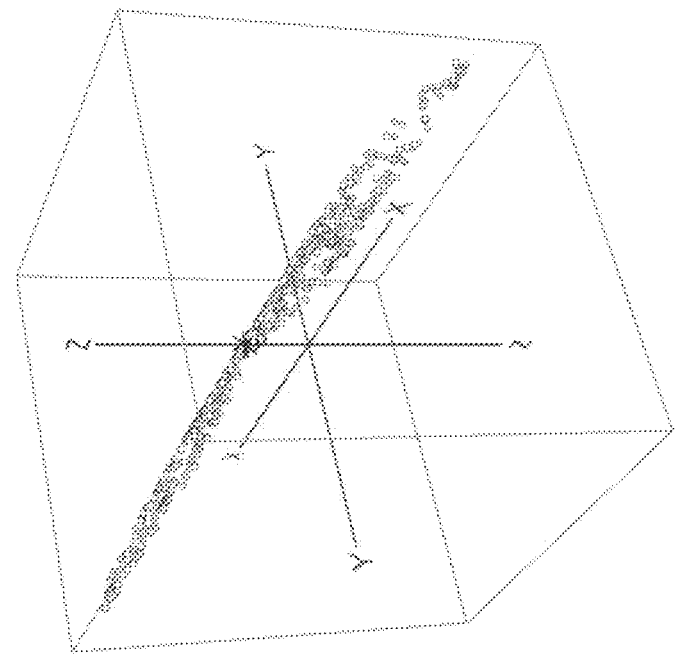
FIG. 4B – Z-Axis Most Orthogonal to W-Ave Plane
Z-Axis Weighted Ave Point is Selected CB Point
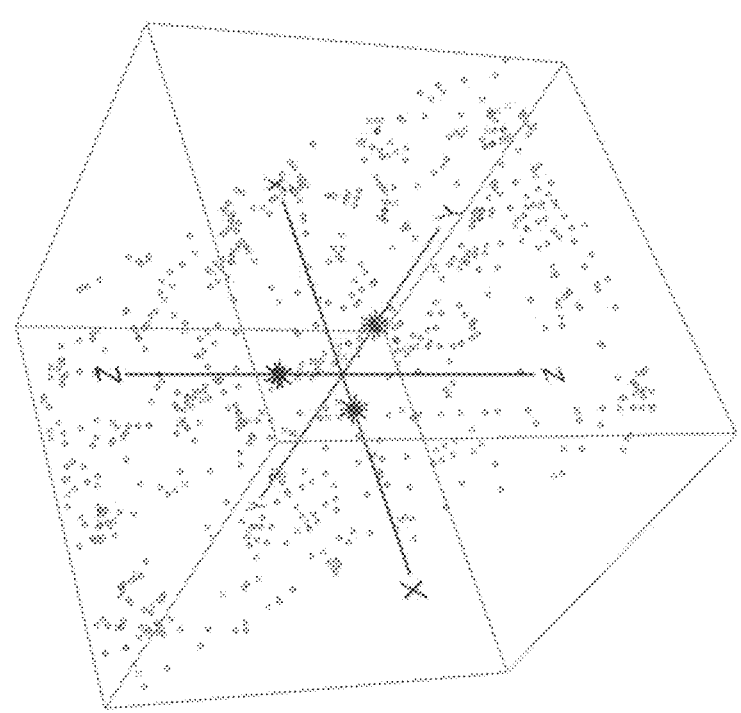
FIG. 4A – All Weighted Ave Points in CB FIG. 6A Stanford Bunny Point Cloud
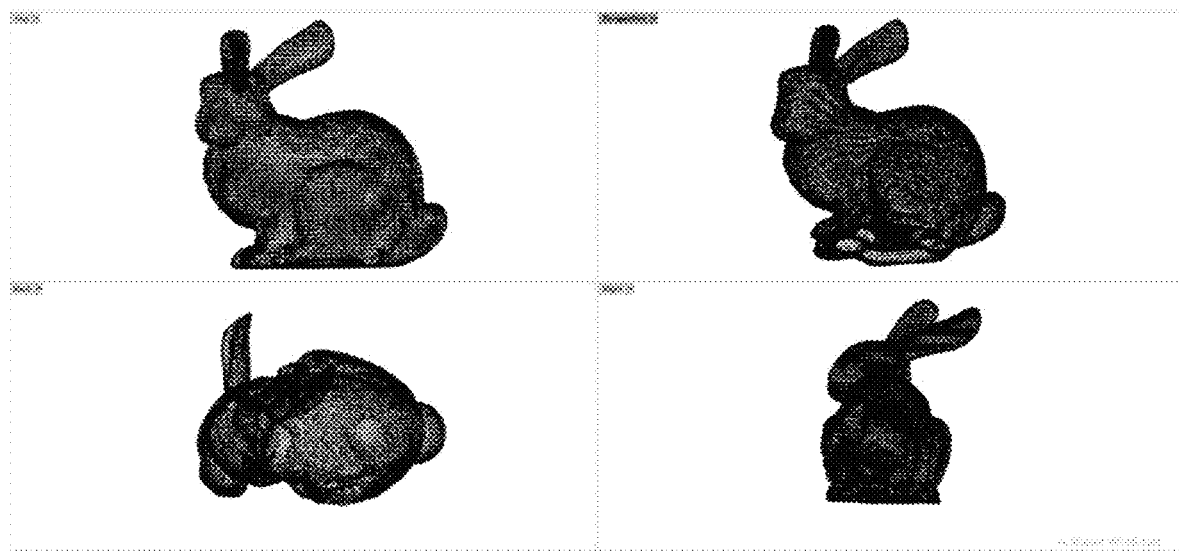

FIG. 6B Point Processed Bunny Global Subsample – Density 25
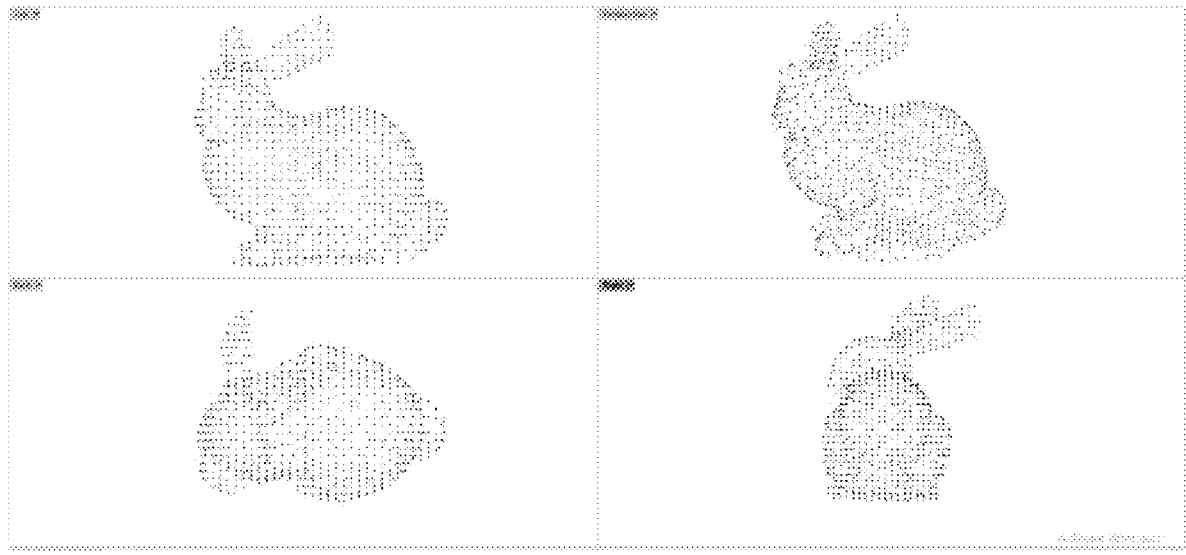
FIG. 6C Point Processed Bunny Global Subsample – Density 35
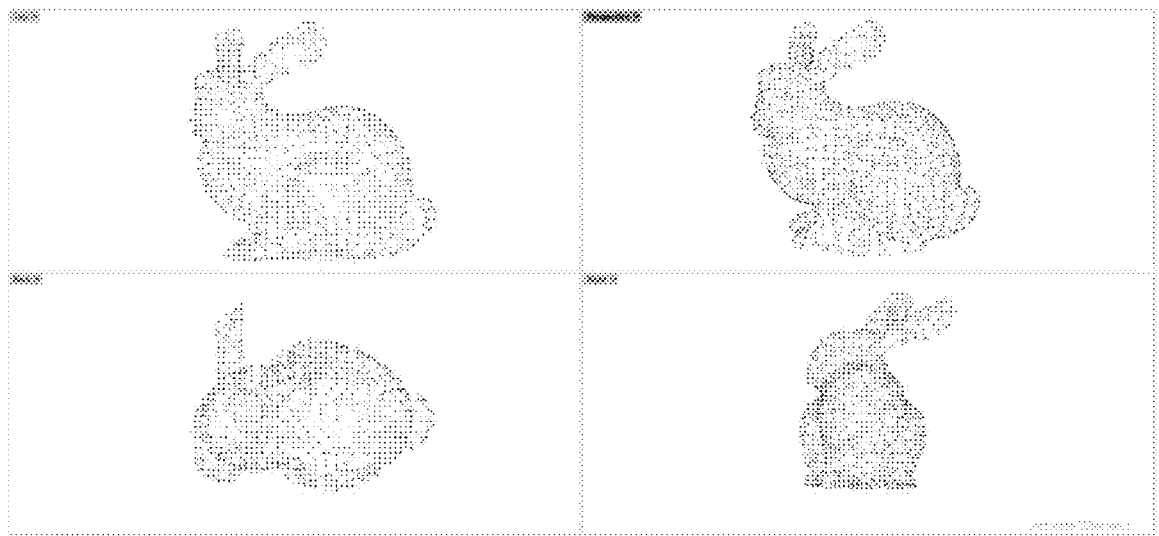

FIG. 6D Point Processed Bunny Planar Subsample – Density 25
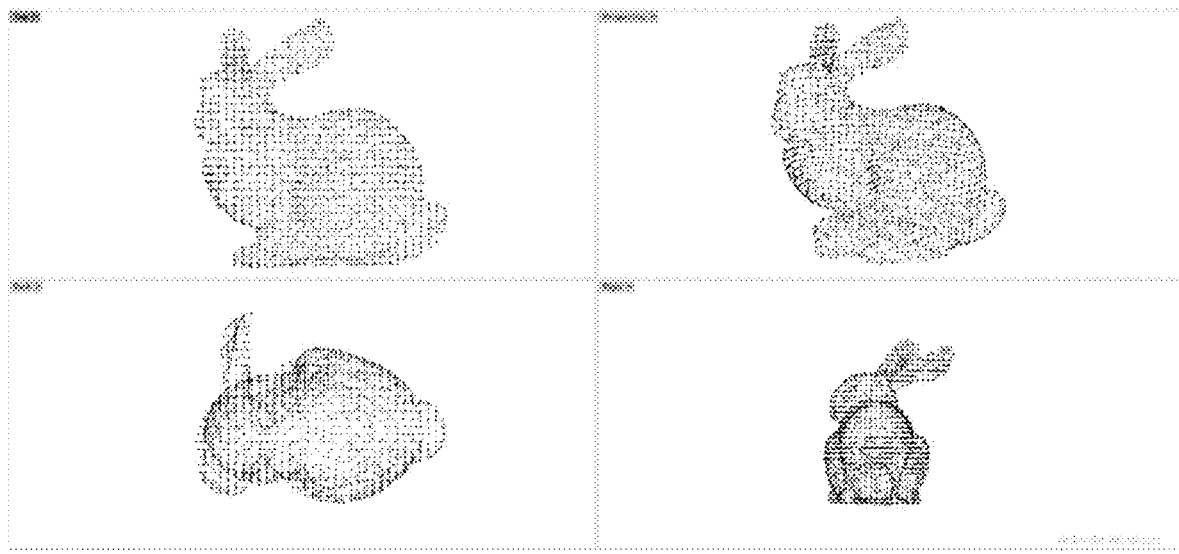
FIG. 6E Point Processed Bunny Planar Subsample – Density 35
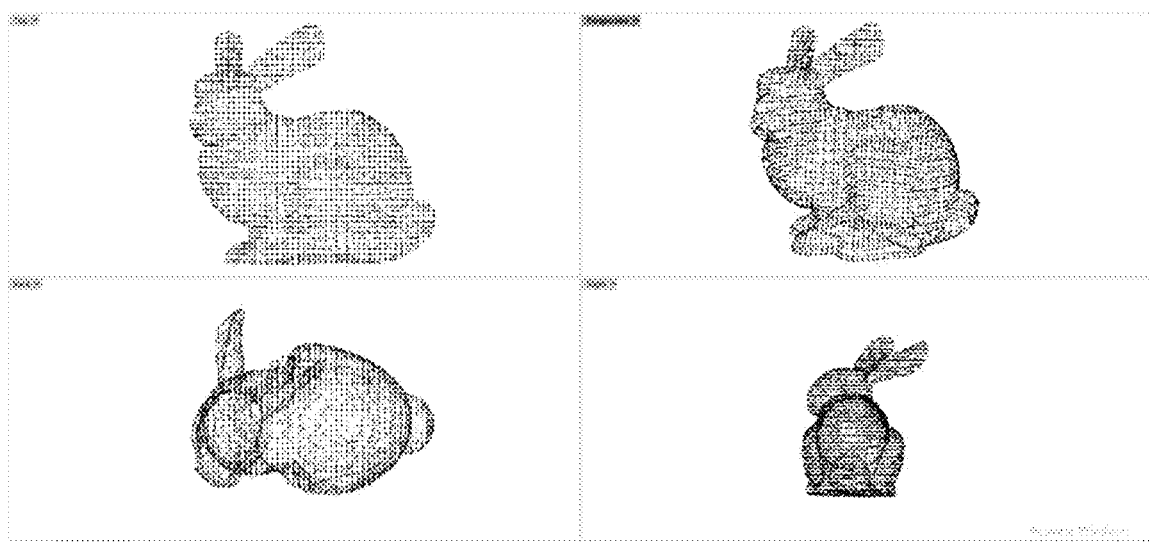

FIG. 7A – Weighted Value WV Equation (x-axis)

$$X_{weight,i} = \left(\frac{1}{X_{distance,i}}\right)^2$$

FIG. 7B – Weighted Average WAV Equation (x-axis)

$$X_{average} = \frac{\sum(X_{distance,i} \cdot X_{weight,i})}{\sum X_{weight,i}}$$

FIG. 7C - Orthogonal Equations $$X_{Relative} = \frac{Maximum(x_{cluster\,points}) - Minimum(x_{cluster\,points})}{Spacing_x}$$

$$Y_{Relative} = \frac{Maximum(y_{cluster\,points}) - Minimum(y_{cluster\,points})}{Spacing_y}$$

$$Z_{Relative} = \frac{Maximum(z_{cluster\,points}) - Minimum(z_{cluster\,points})}{Spacing_z}$$

Fig. 7D $$Range_{min} = minimum(X_{Relative}, Y_{Relative}, Z_{Relative})$$

If $Relative\ Range_X = Range_{min}$:

$$x_{Sample\ Point} = X_{averaged}$$

$$y_{Sample\ Point} = Y_{cluster\ center}$$

$$z_{Sample\ Point} = Z_{cluster\ center}$$

If $Relative\ Range_Y = Range_{min}$:

$$x_{Sample\ Point} = X_{cluster\ center}$$

$$y_{Sample\ Point} = Y_{averaged}$$

$$z_{Sample\ Point} = Z_{cluster\ center}$$

If $Relative\ Range_Z = Range_{min}$:

$$x_{Sample\ Point} = X_{cluster\ center}$$

$$y_{Sample\ Point} = Y_{cluster\ center}$$

$$z_{Sample\ Point} = Z_{averaged}$$

$$Sample\ Point = [x_{Sample\ Point}, y_{Sample\ Point}, z_{Sample\ Point}]$$

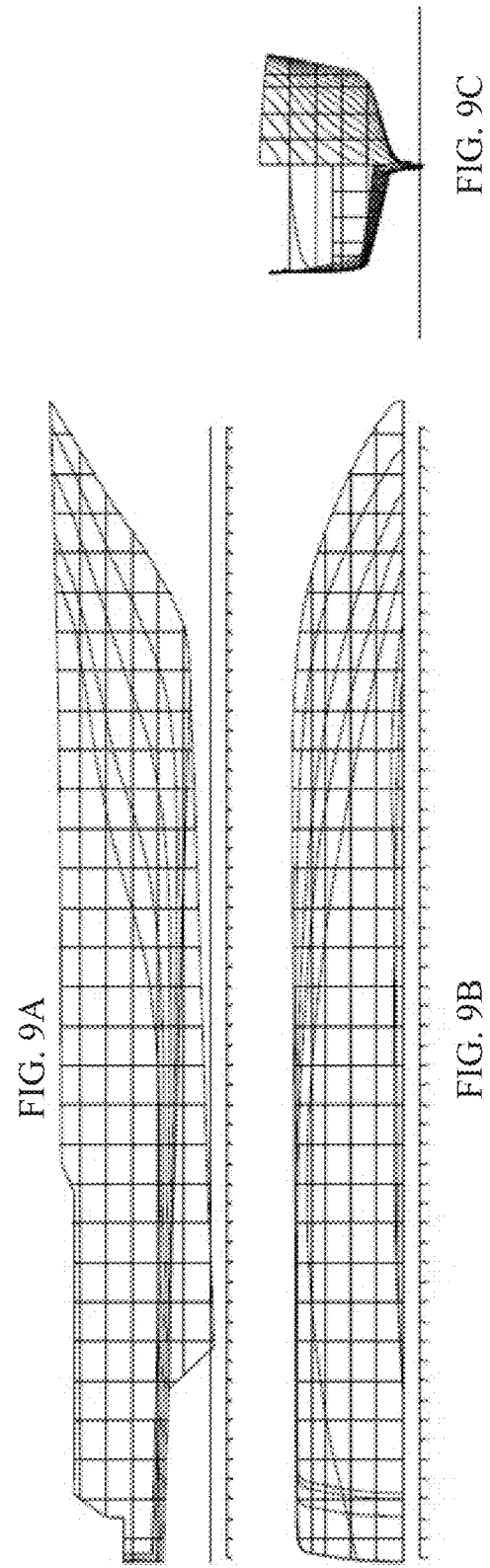

SUBSAMPLING METHOD FOR CONVERTING 3D SCAN DATA OF AN OBJECT FOR MARINE, CIVIL, AND ARCHITECTURAL WORKS INTO SMALLER DENSITIES FOR PROCESSING WITHOUT CAD PROCESSING

CROSS-REFERENCE TO RELATED APPLICATION

This application claims the benefit of priority of provisional patent application Ser. No. 63/225,699, filed Jul. 26, 2021, now pending, the contents of which is incorporated herein by reference thereto.

FIELD OF THE INVENTION

The present invention relates to an improved method of processing 3D scan data of an object, and, more specifically, a subsampling method converting 3D scan image data into smaller densities prior to processing the 3D data with a CAD processing program. The 3D data typically involves large objects which are scanned, such as marine and civil engineering works, and architectural works. Although this invention addresses pre-processing 3D scanned image data, the 3D data can be exported from a CAD program into the pre-processing system and method described herein. The invention contemplates that the pre-processed and subsampled output is transferred or exported into a CAD program for further manipulation by the user.

BACKGROUND OF THE INVENTION

The software application was developed with the intent of reducing labor time associated with processing 3D point clouds in CAD software. Point clouds produced by modern 3D scan technology are often on the order of tens or even hundreds of millions of points. This results in extremely large data files which can be a challenge to store and manage. Additionally, the large file size can often overload or significantly reduce the performance of many CAD packages without specialized or high-performance hardware.

In many instances, the raw 3D scan point cloud is not a commercial deliverable product. Often a point cloud must be converted into drawings and/or surface models. This requires a draftsman or CAD technician to process the scan data point cloud in one of the many commercially available CAD packages. In addition to hardware slowdown resulting from processing large file sizes, point cloud scan data are often 'noisy' and require the CAD user to manually filter and select appropriate points for the basis of creating the deliverable drawings or surfaces. This combination of challenges often results in many hours of tedious labor time to simply extract the basic information needed to produce a deliverable.

There are other subsampler processes on the market today. Most other subsamplers use statistical methods or octree sampling. While these methods are efficient, their output is often a selection of points from the original point cloud—meaning noise is still present and the resulting data is as unstructured as the parent point cloud. In other applications, simple averages are taken from subsamples of the point cloud—meaning that the output data is subsampled, but still unstructured.

The present inventive application's method of subsampling produces structured data output, with each point lying at the intersection of two pre-defined planes and uses a weighted average of nearest neighboring points to define a completely new point. The inventive process is slightly more time consuming than some of the previously mentioned methods, but produces a smoothed, structured set of data which is more readily utilized by CAD technicians and additional CAD processing software.

OBJECTS OF THE INVENTION

It is an object of the present invention to provide an application designed to subsample point clouds in a structured manner and to reduce file size and increase efficiency of CAD processing.

It is another object of the present invention to subsample point cloud scan data in a structured manner, wherein the subsampled points are defined on a grid of pre-defined spatial planes.

It is a further object of the present invention to provide a subsampler which reduces file size by multiple orders of magnitude and produces a set of organized points with minimal 'noise', greatly simplifying the CAD processing and reducing associated labor time.

It is an additional object of the present invention to provide a subsampler which is very lightweight, both with respect to computational speed and data storage and retrieval, and is effectively a standalone executable application.

It is another object of the present invention to provide a subsampler which does not require CAD software or advanced hardware.

It is a further object of the present invention to provide a subsampler having low memory requirements, enabling it to be run on commonly available hardware—including basic laptops.

It is a further object of the present invention to provide a subsampler which breaks the point cloud data into blocks or cubes, and, in that manner, the subsampler application can process very large file sizes using minimal memory. This has the added benefit of allowing the user to utilize the hardware for other common tasks while the point cloud data is processed in the background.

It is an additional object of the present invention to provide a subsampler wherein no cloud computing platforms, processors or data stores are needed, nor are remote computing resources required. The inventive application was designed to run locally on the user hardware. The application does not need nor require an internet connection.

It is a further object of the present invention to provide a subsampler which eliminates noise in the post-processed output, and generates an output which is structured. The inventive application's method of subsampling produces a structured data output, with each point lying at the intersection of two pre-defined planes, and uses a weighted average of nearest neighboring points to define a completely new point. The inventive process is slightly more time consuming than some of the previously mentioned methods, but produces a smoothed, structured set of data which is more readily utilized by CAD technicians or additional processing software.

SUMMARY OF THE INVENTION

The invention provides a subsampling method for converting 3d scan data (sometimes referred to herein as point cloud data) of an object for marine, civil, and architectural works into smaller densities for processing without computer aided design (CAD) processing that overcomes the aforementioned disadvantages of the afore-known devices and methods of this general type and that demand large data stores and fast processors.

With the foregoing and other objects in view, there is provided, in accordance with the invention, a pre-processing subsampling method for converting 3D imaging scan data having a plurality of high-density 3D scan data points into a smaller density data set without engaging CAD programs. The method involves first, operationally, orientation of the original 3D scan data point cloud to align with a desired x, y and z axes prior to importing the file into the pre-processing sub sampler. The aligned point cloud is saved or exported to one of the supported coordinate file types: .csv, .txt, .pts, or .xyz. In one embodiment, the coordinates need to be exported as "comma separated". The file is imported into pre-processing subsampler and the user defines a subsampling density, and whether automatic or custom sample planes are to be used. In the subsampling algorithm, the point cloud is split into smaller volumes referred to as Cluster Bounds (CB), with the sample planes centered within each Cluster Bound. Each Cluster Bound is analyzed individually, and one subsampled point will be produced per Cluster Bound. Within each Cluster Bound, centerlines in the x, y, and z directions are defining the sample planes, and are used as references for the points within the Cluster Bound. The Euclidean distance (ED) is calculated for each point to the x, y, and z axis, respectively. A radius around each axis is defined by the subsampler engine. To ensure that the most relevant points in way of the axes are considered in the sub sampling, only points within this Radial Distance around each axis are retained (the cylindrical region coaxial with the respective axis), and any points outside the Radial Distance or cylinder are ignored. This process is done for each axis individually. Points within the Radial Distance or cylinder are then weighted such that points closer to the axis will have a higher contribution to the final subsampled point. The Weighted Value (WV) of each of the retained points is calculated as the square of the inverse of the distance to the axis. For each axis, a Weighted Average (WAV) of the points is calculated. The Weighted Average is calculated as the sum of each original point coordinate multiplied by its Weighted Value, divided by the sum of all the Weighted Values. This results in one composite subsampled point for each axis, and three subsampled points in total for the Cluster Bound. One of these three points is to be selected as the most representative point for the Cluster Bound. The axis most nearly orthogonal to the Weighted Average points within the Cluster Bound is likely to be the most accurate, therefore the point on this axis is selected as the final subsampled output point. There are several algorithms to determine the axis nearly orthogonal to each WAV. In order to accelerate the subsampling process for the entire point cloud, the subsampling process is done for all the Cluster Bounds in parallel. Once the subsampling is completed, the user can request the output file in any of the above-mentioned supporting file formats. The supported file formats are simple comma separated coordinate files that can be imported into most CAD programs.

In a preferred embodiment, nearly all of the process steps operate on the input scan image data in parallel, that is, as a single process. Reduced file can be stored for BIM/Digital Twin or used for further processing such as 2D drawings, surface modeling/reverse engineering, taking measurements, interference checks, etc. The advantages of the pre-processing sampler include elimination or significant reduction of noise, the subsampling method produces a structured scan, reduces file size of the point cloud scan data, increases accuracy, and the pre-processing sampler can be run on a laptop or ordinary desktop.

There is further provided, in accordance with the invention, a pre-processing subsampling method for converting 3D imaging scan data having a plurality of 3D data points (a high density point cloud) into a smaller density data set without engaging CAD programs. The method involves selecting a subsampling density from at least a portion of the high-density 3D scan data point cloud and also selecting an x, y, z coordinate system for the subsampling process. The "portion" may be the entire 3D high density point cloud or may be only a small segment of the high-density cloud (the term "portion" to include the entire 3D scan or a smaller part thereof). The 3D scan data (point cloud data) is segmented into a plurality of cubic or rectangular regions oriented with the selected x, y, z coordinate system. Alternatively, rectangular regions can be used instead of cubic regions. To simply the explanation of the inventive method, reference herein to a "cubic" region is meant to encompass a rectangular region (hence, the Cluster Bound CB may be cubic or rectangular). Thereafter, the process orients a subsampling x, y, z coordinate system ("SubSys") at a centroid of each cubic/rectangular subsampling region of the plurality of cubic regions. This subsampling x, y, z coordinate system is sometimes referred to herein as a "SubSys" to distinguish it from the selected x, y, z coordinate system imposed on the entire scan point cloud data. The centroid of the cube is the cubic origin of the SubSys. The centroid of the rectangle subsampling region is the centroid of the SubSys. The SubSys is also oriented with the earlier selected x, y, z coordinate system. The method applies 3 cylindrical regions, coaxial with the SubSys x, y, and z axes, within the subsampling CB and the constituent scan data in the respective x, y, and z cylinders is processed by the subsampling program. There is one cylinder per axis imposed by a Radial Distance (RD) limit to all constituent scan data within the x, y, and z cylinders, sometimes called "C-points" herein. This RD limited x, y, z cylinders is applied by obtaining the Euclidean distance (ED) of each C-point to the respective x, y, z SubSys axis (EDx1 . . . n, EDy1 . . . n, EDz1 . . . n). These cylindrical regions are coaxial with the x, y, z SubSys axes. The result being referred to as x-axis, y-axis and z-axis cylinders, each with a portion of constituent C-point scan data therein. In the event there are no constituent scan data points in the x, y, z cylinders, then a null value is applied during the subsampling routine. Each scan data point in the x, y, z cylinders defines a subsampling C-point for the subsampling region. C-points outboard of the RD or x, y, z cylinders are ignored. The process then computes a weighted value (WV) for each C-point EDx1 . . . n, EDy1 . . . n, EDz1 . . . n in each x, y, z cylinder. The algorithm for the weighted value assigns a weight to the C-point such that C-points closer to the respective x, y, z SubSys axis are correlatively weighted greater than C-points farther away from the respective x, y, z SubSys axis. For example, for each axis, the following Formula 1 is instructive:

$$WV_{x1}=(1/ED_{x1})*(1/ED_{x1})\ldots WV_{xn}=(1/ED_{xn})*(1/ED_{xn}).$$

Once the weighted value (WV) for each C-point in the x, y, z, cylinder is computed, the process computes a weighted average (WAV) of all C-points in the x, y, z cylinder. This weighted average value is called WAVx-axis, WAVy-axis, WAVz-axis). For example, the following Formula is instructive:

WAVx-axis=((EDx1*WVx1)+(EDx2*WVx2)+...
(EDxn*WVxn))÷(WVx1+WVx2+... WVxn).

The process then determines which corresponding x-axis, y-axis and z-axis is nearly orthogonal to the collection of WAVx-axis, WAVy-axis, WAVz-axis points. Once this near orthogonal axis is located, the nearest weighted average value C-point is the resultant and is a single subsampled output (SSO) point for the entire cubic region. The remaining or non-elected or non-selected weighted average values are not used or are discarded. To achieve fast processing, all cubes or cubic regions are processed substantially in parallel. An SSO point for each cubic region is the output for the entire pre-sampled point cloud. In accordance with another feature, the present invention outputs or exports all SSO points for all cubic regions to the CAD program.

In accordance with another feature, an embodiment of the present invention includes computing the weighted value (WV) of each corresponding C-point (each C-point identified by coordinates EDx1... n, EDy1... n, EDz1... n) is obtained by taking the square of the inverse of each ED for each corresponding C-point EDx1... EDxn, EDy1... EDyn, and EDz1... EDzn.

In accordance with an additional feature, an embodiment of the present invention includes computing the weighted average WAVx-axis, WAVy-axis, and WAVz-axis for each x-axis, y-axis and z-axis cylinder, by FIRST calculating the sum of each point coordinate EDx1... EDxn, EDy1... EDyn, and EDz1... EDzn multiplied by its weighted value WVx1... WVxn, WVy1... WVyn, and WVz1... WVyn, and SECOND dividing the resultant sum by the sum of all the weighted values WVx1+... WVxn, WVy1+... WVyn, and WVz1+... WVzn. The dividend is the sum of each point coordinate EDx1... EDxn, EDy1... EDyn, and EDz1... EDzn multiplied by its weighted value WVx1... WVxn, WVy1... WVyn, and WVz1... WVyn. The divisor is the sum of all the weighted values WVx1+... WVxn, WVy1+... WVyn, and WVz1+... WVzn, is the divisor. The resultant is the quotient, the weighted average WAVx-axis, WAVy-axis, and WAVz-axis for each x-axis, y-axis and z-axis cylinder.

In accordance with a further feature, an embodiment of the present invention includes selecting the x, y, z coordinate system by establishing a spatial reference for the plurality of data points, and segmenting the scan data into the plurality of cubic regions establishes a spatial reference domain for each cubic region, wherein each cubic region of the plurality of cubic regions has a cubic portion of data points from the plurality of data points.

An additional feature of an embodiment of the present invention includes selecting the subsampling density of the input point cloud by selecting one subsampling input data density of a plurality of subsampling densities. These selectable densities include a coarse, medium, and a fine density. The coarse density defines m units within a selected axial span encompassing a span of the input data points; the medium density defines n units in the input data cloud; and the fine density defines o units within the input point cloud, wherein m>n>o. The user may optionally select the density or the density may be pre-set.

Another feature of an embodiment of the present invention establishes, once the input cloud density is selected, the cubic regions wherein each cubic region includes a pre-defined number of units.

In accordance with another feature, an embodiment of the present invention includes, in connection with applying the corresponding cylindrical region about the respective x, y, z SubSys axis, providing a coarse, medium, and fine cylindrical regions having corresponding radii of p, q, and r units wherein p>q>r. The application of coarse, medium, and fine cylindrical regions is based upon the coarse, medium or fine selection for the sub sampling density. Once the coarse, medium, and fine cylindrical region is selected, the selected coarse, medium, and fine cylindrical region is applied to the cubic/rectangular subsampling regions to enable obtaining corresponding C-points, EDx1... EDxn, EDy1... EDyn, and EDz1... EDzn.

Although the invention is illustrated and described herein as embodied in the subsampling method for converting 3d scan data (sometimes referred to herein as point cloud data) of an object for marine, civil, and architectural works into smaller densities for processing without computer aided design (CAD) processing, it is, nevertheless, not intended to be limited to the details shown because various modifications and structural changes may be made therein without departing from the spirit of the invention and within the scope and range of equivalents of the claims. Additionally, well-known elements of exemplary embodiments of the invention will not be described in detail or will be omitted so as not to obscure the relevant details of the invention.

Other features that are considered as characteristic for the invention are set forth in the appended claims. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one of ordinary skill in the art to variously employ the present invention in virtually any appropriately detailed structure. Further, the terms and phrases used herein are not intended to be limiting; but rather, to provide an understandable description of the invention. While the specification concludes with claims defining the features of the invention that are regarded as novel, it is believed that the invention will be better understood from a consideration of the following description in conjunction with the drawing figures, in which like reference numerals are carried forward.

Before the present invention is disclosed and described, it is to be understood that the terminology used herein is for the purpose of describing particular embodiments only and is not intended to be limiting. The terms "a" or "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The term "providing" is defined herein in its broadest sense, e.g., bringing/coming into physical existence, making available, and/or supplying to someone or something, in whole or in multiple parts at once or over a period of time.

In the description of the embodiments of the present invention, it should be noted that, unless otherwise clearly defined and limited, terms "about" or "approximately" or "near" apply to all numeric values, whether or not explicitly indicated. These terms generally refer to a range of numbers that one of skill in the art would consider equivalent to the recited values (i.e., having the same function or result).

The terms "program," "software application," and the like as used herein, are defined as a sequence of instructions designed for execution on a computer system. A "program," "computer program," or "software application" may include a subroutine, a function, a procedure, an object method, an object implementation, an executable application, an applet, a servlet, a source code, an object code, a shared library/dynamic load library and/or other sequence of instructions designed for execution on a computer system. Those skilled in the art can understand the specific meanings of the above-mentioned terms in the embodiments of the present invention according to the specific circumstances.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and explain various principles and advantages all in accordance with the present invention.

FIG. 1 graphically illustrates a cubic region or cluster bound (CB) boundaries for a plurality of cubic points (C-points) in the cubic region (the spatial distribution and concentration of C-points being exemplary), and also illustrates the cubic or CB subsampling x, y, z coordinate system ("SubSys") at a centroid of the cubic or CB region wherein the origin of the SubSys is on the cube's centroid. Rectangular CBs can be used and the discussion of cubic CBs is not meant to limit the invention to only cubic CBs. Rectangular CBs also have centroids which are used to apply the sub sampling x, y, z axes.

FIGS. 2A, 2B and 2C respectively graphically illustrate the x, y, and z cylinders in the cubic region or cluster bound (CB). The C-points outboard of the x, y, and z processing cylinders are not processed by the subsampling method and, as a result, are not shown in the figures.

FIGS. 3A, 3B and 3C respectively graphically illustrate the x, y, and z weighted average points, that is, the WAVx-axis, WAVy-axis, and WAVz-axis points.

FIG. 4A graphically illustrates all three x, y, and z weighted average points, that is, the WAVx-axis, WAVy-axis, and WAVz-axis points, in the CB, and FIG. 4B graphically illustrates the selection of WAVz-axis point as the single subsampled output SSO of the CB because the z-axis is nearly orthogonal the plane formed by the WAVx-axis, WAVy-axis, and WAVz-axis points.

FIGS. 6A through 6E illustrate (i) the Stanford Bunny point cloud using scan image data from the Stanford University Computer Graphics Laboratory and (ii) point processed images using the present inventive method. FIG. 6A showing the Stanford Bunny Point Cloud; FIG. 6B showing the Point Processed Bunny Global Subsample—Density 25; FIG. 6C showing the Point Processed Bunny Global Subsample—Density 35; FIG. 6D showing the Point Processed Bunny Planar Subsample—Density 25; and FIG. 6E showing the Point Processed Bunny Planar Subsample—Density 35.

FIGS. 7A, 7B, 7C and 7D respectively show the mathematical equations for computing (i) the weighted value (WV) for the x-axis C-points; (ii) the weighted average value (WAV) for the x-axis (equations for the y-axis and the z-axis are identical); (iii) the orthogonal equations; and (iv) each element of the sample data array.

FIGS. 9A, 9B and 9C graphically illustrate a hull lines plan (starboard side view, hull view and bow sectional view) created from the pre-processing subsampler outputs useful for further processing 2D drawings, surface modeling/reverse engineering, taking measurements, and interference checks, etc.

DETAILED DESCRIPTION

Figure 5:
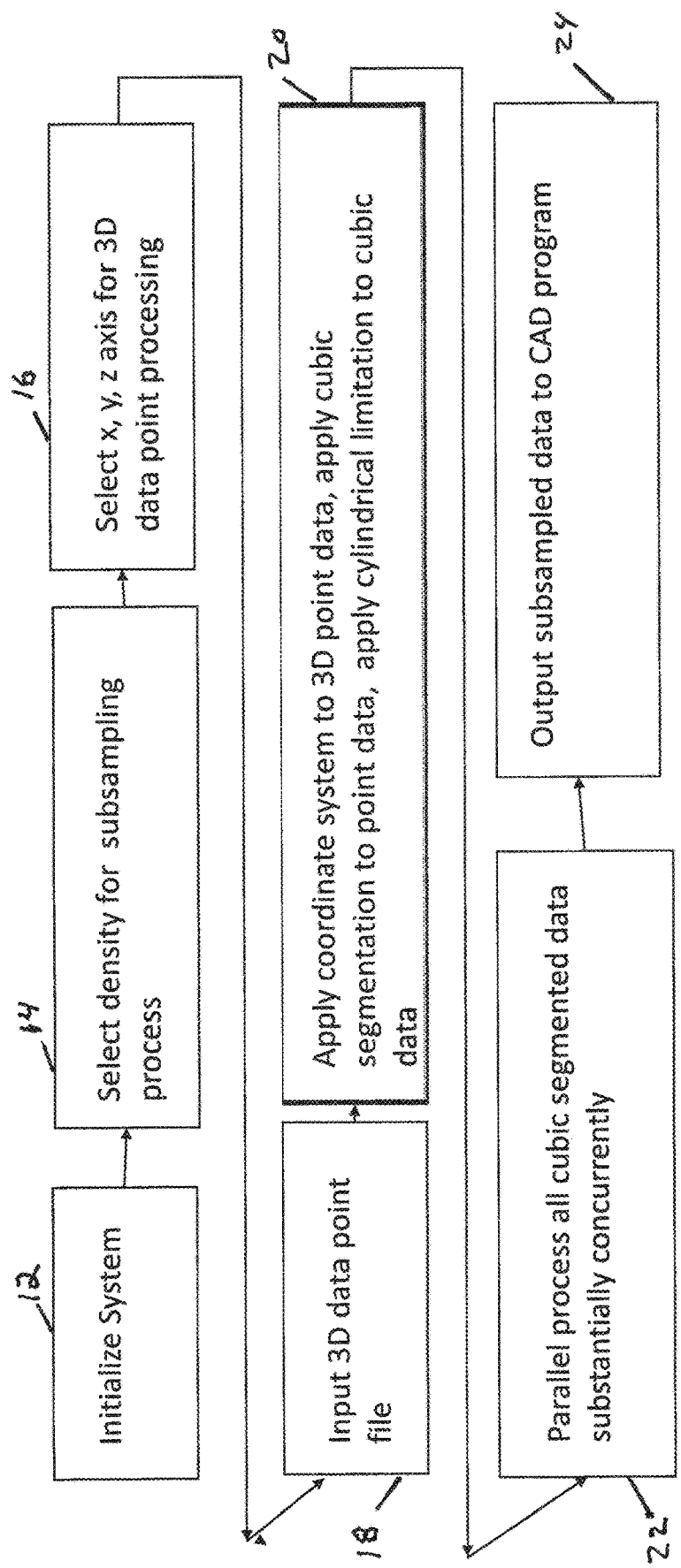
FIG. 5 diagrammatically illustrates a general flow chart for the subsampling process.
Figure 8C:
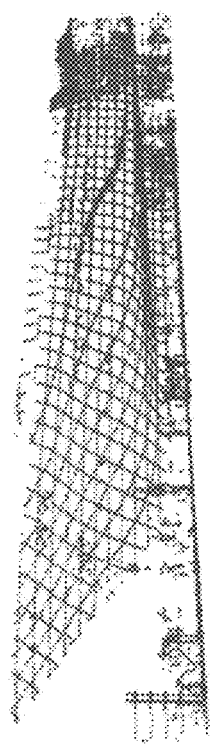
FIGS. 8A, 8B, 8C and 8D graphically illustrate CAD outputs (hull view, starboard side view, perspective view and sectional view) after pre-processing by the subsampler wherein the original point cloud as 0.7 GB and the pre-processed output was 0.7 MB.
Figure 8D:
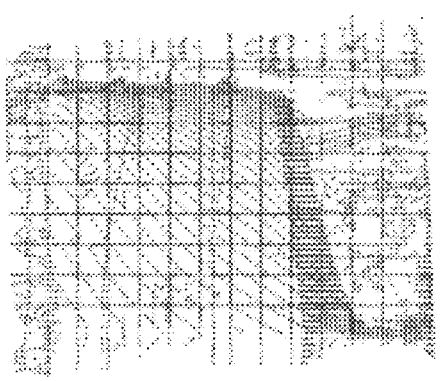
Figure 8A:
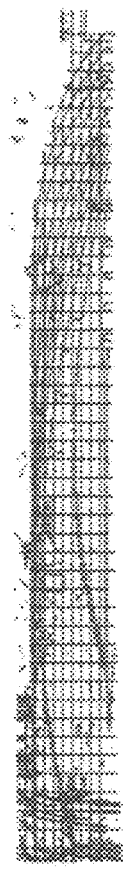
Figure 8B:
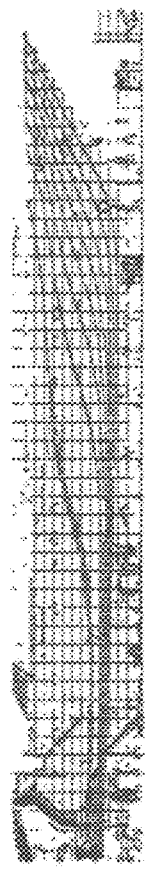

While the specification concludes with claims defining the features of the invention that are regarded as novel, it is believed that the invention will be better understood from a consideration of the following description in conjunction with the drawing figures, in which like reference numerals are carried forward. It is to be understood that the disclosed embodiments are merely exemplary of the invention, which can be embodied in various forms. It should be noted that although the flow chart in FIG. 5 shows a specific order of executing the process steps, the order of executing the steps may be changed relative to the order shown in that embodiment. Also, two or more blocks shown in succession may be executed concurrently or with partial concurrence in some embodiments. Certain steps may also be omitted in FIG. 5 for the sake of brevity.

Initially, in connection with FIGS. 1-4B, 7A, 7B and 7C, the details of the subsampler will be explained herein. Thereafter, to overall operations of the inventive subsampler will be explained in connection with FIG. 5 (the process flow chart). Finally, the outputs of the subsampler are explained in connection with FIGS. 6A-E and 8A-9C.

In setting up the point cloud scan data file, the orientation of the original point cloud is aligned with desired x, y and z axes prior to importing the file into the pre-processing subsampler. The aligned point cloud is saved or exported to one of the supported coordinate file types: .csv, .txt, .pts, or .xyz. In one embodiment, the coordinates need to be exported as "comma separated" into the operational subsampler. Thereafter, the file is imported into pre-processing subsampler and the user defines a subsampling density, and whether automatic or custom sample planes are to be used.

FIG. 1 graphically illustrates a cubic region or cluster bound (CB) boundaries for a plurality of cubic points (C-points) in the cubic region (the spatial distribution and concentration of C-points being exemplary), and also illustrates the cubic or CB subsampling x, y, z coordinate system ("SubSys") at a centroid of the cubic or CB region wherein the origin of the SubSys is on the cube's centroid. 3D scan data falling within the CB boundary (whether a cubic CB or a rectangular CB) is referred to as "constituent scan data points." If a particular CB has no 3D scan data points therein, a null value is applied. In other words, the term "constituent scan data point" also refers to the null data set.

In the subsampling algorithm, the point cloud is split into smaller volumes referred to as Cluster Bounds (CB), with the sample planes centered within each Cluster Bound. Each Cluster Bound is analyzed individually, and one subsampled point will be produced per Cluster Bound. Further detail of this initial process is discussed later in connection with FIG. 5. Within each Cluster Bound, centerlines in the x, y, and z directions are defining the sample planes, and are used as references for the points within the Cluster Bound. The CB axes match and are consistent or oriented with the axes selected initially by the user, as described later in connection with FIG. 5. The CB axes origin (cubic origin) is at the cubic centroid. In FIG. 1, within each CB, centerlines in the x, y, and z directions are defining the sample planes, and are used as references for the points within the CB. See FIG. 1.

FIGS. 2A, 2B and 2C respectively graphically illustrate the x, y, and z cylinders in the cubic region or cluster bound (CB). The C-points outboard of the x, y, and z processing cylinders are not processed by the subsampling method and, as a result, are not shown in the figures.

In connection with FIGS. 2A to 2C, the Euclidean distance (ED) is calculated for each point to the x, y, and z axis, respectively. A radius around each axis is defined by the subsampler engine, sometimes referred to herein as the Radial Distance (RD). Sometimes herein the radius is referred to as a cylindrical region coaxial with the respective axis. The use of the cylindrical region is to ensure that the most relevant points in way of the axes are considered in the subsampling, only points within this Radial Distance around each axis are retained or processed by the subsampler (the cylindrical region coaxial with the respective axis), and any points outside the Radial Distance or cylinder are ignored. This process is done for each axis individually.

Stated otherwise, the method applies 3 cylindrical regions on the cubic scan data, one cylinder per axis, by imposing the Radial Distance (RD) limit to all C-points (C-points being all data points in the cube or CB). This RD or cylindric processing is done by obtaining the Euclidean distance (ED) of each C-point to the respective x, y, z SubSys axis (EDx1...n, EDy1...n, EDz1...n). These cylindrical regions are coaxial with a the cubic's x, y, z SubSys axes. The result being referred to as x-axis, y-axis and z-axis cylinders, each with a portion of the scan data therein. Each scan data point in the x, y, z cylinders defines a subsampling C-point for the cubic region. C-points outboard of the RD or x, y, z cylinders are ignored.

Explained differently, for each Cluster Bound (CB) in the cluster array (this array being all scan data points to be processed), the CB Centerline is determined along each axis (x, y, z) where a CB Axial Centerline is defined as a line parallel to the corresponding cluster array axis and passing through the center of the Cluster Bound. This is graphically represented in FIG. 1. Along each direction (x, y, z) the Euclidian Distance (ED) of each point to the corresponding axis Cluster Axial Centerline is calculated. Within the subsampler, this ED calculation is performed in parallel (that is, all CBs are processed substantially simultaneously, thereby reducing processing time). An array of ED distances is created for each axis. The next step is determining the Cluster Axial Centerline nearest neighbors. For each axis (x, y, z), a Radial Search Distance (RSD) is defined within the subsampler engine. This Radial Search Distance is set as some portion of the dimensions of the Cluster Bounds corresponding to the direction of the axis. This RSD or size of the x, y, z data processing cylinders can be set automatically (as explained later in connection with FIG. 5) based upon the user-defined density setting which density setting effectively determines the size of each CB in the entire scan data array being processed. As an enhancement, the user may select the size of the RSD.

Along each axis (x, y, z), for each C-point in each Cluster Bound (CB), the subsampler engine determines if the ED distance to the point is greater or less than the corresponding Radial Search Distance and creates an array of Distance Multipliers. For each C-point, if the C-point distance is greater than the Radial Search Distance, the multiplier is set to zero. Otherwise, the multiplier is set to 1. For each axis, the previously computed ED distance array is multiplied by its corresponding Distance Multiplier array (the 0 or 1 multiplier), with the result being that the distance value of points lying outside of the Radial Search Distance is set to zero, while the distance values of points within the Radial Search Distance are unchanged. This ensures that only the points nearest the Cluster Axial Centerline(s) contribute to the final subsampled point. Stated otherwise, C-points outboard of the x, y, z cylinders are ignored by the subsampler.

In a further enhancement, the RSD can be pre-set based upon the total length of the point cloud to the processed (the physical length of the object scanned) and the coarse, medium or fine subsample selection made by the user. A coarse setting referring to larger CBs compared to a fine setting. As discussed below, the user can also set a custom subsampling control on the system. Alternatively, the user could set both the coarse, medium or fine subsample selection and the RSD size for thee data capturing cylinder about each axis in the CB.

FIGS. 3A-4B are discussed concurrently herein. FIG. 3A illustrates a cluster bound. FIGS. 3B and 3C respectively graphically illustrate the x, y, and z weighted average points, that is, the WAVx-axis, WAVy-axis, and WAVz-axis points. FIG. 4A graphically illustrates all three x, y, and z weighted average points, that is, the WAVx-axis, WAVy-axis, and WAVz-axis points, in the CB. FIG. 4B graphically illustrates the single subsampled output (SSO) point for the cubic region, that is, in this example, WAVz-axis, which is determined to be the weighted average point value (WAV) on the z-axis most nearly orthogonal to the collection of WAVx-axis, WAVy-axis, WAVz-axis points.

After C-points inboard the RSDs or axial cylinders are identified, the subsampler engine computes (a) a Weighted Value (WV) for each cylinder captured C-point and (b) the Weighted Average Value (WAV) for all captured C-points in the RSD or cylinder on a per axis basis. See FIGS. 3A-4A. The purpose of computing WV for each C-Point within the RSD is to ensure that points closer to the axis will have a higher "weight" contribution to the final subsampled point for the CB being processed. The Weighted Value (WV) of each of the retained points is calculated as the square of the inverse of the distance to the axis. Since the inverse of the square is computed, small coordinate WV values approaching zero are discarded in the WV and WAV process. In one embodiment, WV coordinate values close to zero or approaching zero are disregarded in calculating WV. This "near zero" computation and deletion is a common program. Thereafter, for each axis, a Weighted Average (WAV) of the captured C-points is calculated. See FIGS. 3A-3C. The Weighted Average WAV is calculated as the sum of each original point coordinate multiplied by its Weighted Value, divided by the sum of all the Weighted Values. This results in one composite subsampled point for each axis, and three subsampled points in total for the Cluster Bound. See FIG. 4A. One of these three points is to be selected as the most representative point for the Cluster Bound as the single subsampled output SSO. See FIG. 4B. The axis most nearly orthogonal to the WAV points within the Cluster Bound is likely to be the most accurate, therefore the point on this axis is selected as the final subsampled output point. See FIG. 4B. In order to accelerate the subsampling process for the entire point cloud, the subsampling process is done for all the Cluster Bounds in parallel.

There are several algorithms to determine the nearly orthogonal axis to the plane formed by WAVx-axis, WAVy-axis and WAVz-axis. One methodology is to select the highest absolute numeric value of WAVx-axis, WAVy-axis and WAVz-axis (ignoring the negative value of WAVx-axis, WAVy-axis and WAVz-axis). Since all the WAV points fall on a coordinate axis, x-axis, y-axis and z-axis, another method processes the orthogonal projection from each WAVx-axis, WAVy-axis and WAVz-axis data point to the opposing axes and select the shortest orthogonal projection from all orthogonal projections. For example, considering WAVz-axis data, one would obtain the orthogonal projection from WAVx-axis to the z-axis (WAVx-p1z) and obtain orthogonal projection from WAVy-axis to the z-axis (WAVy-p1z). The process repeats to obtain WAVx-p1y, WAVy-p1x, WAVz-p1x and WAVz-p1y. The lowest value of all orthogonal projections is the nearly orthogonal axis. If the absolute value of WAVx-axis, WAVy-axis and WAVz-axis are equal, then any WAV point is the SSO. If the absolute values of two WAV data points are equal (forming an isosceles plane), then the orthogonal projection values are equal. Stated otherwise, IF WAVx-axis=WAVy-axis, THEN WAVx-p1z=WAVy-p1z, and the nearly orthogonal axis is z-axis and the SSO is WAVz-axis. Lastly, since the WAV point collection has numerous orthogonal projections to the opposing WAVx-axis, WAVy-axis and WAVz-axis points, one selects each WAV and determines the orthogonal projections to the opposing x, y, z axis. The selected most orthogonal axis is the shortest orthogonal projection to the opposing x, y, z axes. Another method to determine the nearly orthogonal axis locates the centroid of the surface for defined by WAVx-axis, WAVy-axis and WAVz-axis and the orthogonal projections to x-axis, y-axis and z-axis could be computed. The smallest value of these orthogonal projections points to the nearly orthogonal axis.

Stated otherwise, the process computes a weighted value (WV) for each C-point $EDx1 \ldots n$, $EDy1 \ldots n$, $EDz1 \ldots n$ in each x, y, z cylinder. The sub sampling algorithm for the weighted value assigns a weight to the C-point such that C-points closer to the respective x, y, z SubSys axis are correlatively weighted greater than C-points farther away from the respective x, y, z SubSys axis. The following Formula 1 is instructive.

TABLE

WV FORMULA $WVx1 = (1/EDx1)*(1/EDx1) \ldots WVxn = (1/EDxn)*(1/EDxn)$
$WVy1 = (1/EDy1)*(1/EDy1) \ldots WVyn = (1/EDyn)*(1/EDyn)$
$WVz1 = (1/EDz1)*(1/EDz1) \ldots WVzn = (1/EDzn)*(1/EDzn)$ Once the weighted value (WV) for each C-point in the x, y, z, cylinder is computed, the process computes a weighted average (WAV) of all C-points in the x, y, z cylinder. See FIGS. 3A-3C. This weighted average value is called WAVx-axis, WAVy-axis, WAVz-axis). The following Formula 2 is instructive.

TABLE

WAV FORMULA $WAVx\text{-axis} = ((EDx1*WVx1) + (EDx2*WVx2) + \ldots (EDxn*WVxn)) \div (WVx1 + WVx2 + \ldots WVxn)$
$WAVy\text{-axis} = ((EDy1*WVy1) + (Edy2*WVy2) + \ldots (EDyn*WVyn)) \div (WVy1 + WVy2 + \ldots WVyn)$
$WAVz\text{-axis} = ((EDz1*WVz1) + (EDz2*WVz2) + \ldots (EDzn*WVzn)) \div (WVz1 + WVz2 + \ldots WVzn)$ The process then determines which corresponding x-axis, y-axis and z-axis is most nearly orthogonal to the WAVx-axis, WAVy-axis, WAVz-axis points. See FIG. 4A. Once this "near orthogonal axis" is located, the nearest weighted average value C-point is the resultant and is a single subsampled output (SSO) point for the entire cubic region. See FIG. 4B. Note that the SSO may be further processed as discussed below. The remaining or non-elected or non-selected weighted average values are not used for the Cluster Bound selected output. To achieve fast processing, all cubes or cubic regions (Cluster Bounds CBs) are processed substantially in parallel. An SSO point for each cubic region (see FIG. 4B) is the output for the entire pre-sampled point cloud. In accordance with another feature, the present invention outputs or exports all SSO points for all cubic regions to the CAD program.

As a further explanation in one embodiment of the invention, calculating weighting values includes, for each CB, and for each axis (x, y, z), calculating the reciprocal of the ED distance values for each C-point with the RSD or cylinder, and then squaring that ED reciprocal to determine the Weighted Value WV of each point in the truncated CB (that is, truncated by the RSD or cylinder). See WV equation in FIG. 7A. This method of weighting ensures that points which are nearer the Cluster Axial Centerline have a higher contribution to the final subsampled point (the subsampled output or SSO) than points which are further from the Cluster Axial Centerline. Since the inverse of the square is computed, small coordinate values approaching zero are discarded in the WV process.

With respect to the weighted average WAV equation in FIG. 7B, for each captured C-point in each CB and for each axis (x, y, z), the original x, y, z coordinates are combined with their corresponding Weighting Values WV to determine a weighted average coordinate for each axis (the WAVx-axis, WAVy-axis and WAVz-axis). This results in each Cluster CB having three independent Weighted Average points, with one point for each axis. See FIG. 4A.

With respect to FIGS. 4A and 4B, once a weighted average point has been determined for each axis within each Cluster CB, each Cluster then has three possible sampled points. See FIG. 4A. One of these points is selected to be the most accurately representative sample point for the Cluster CB, such that the subsampling engine ultimately produces only one sample point per Cluster, that is, the subsampled output SSO. The axis nearly orthogonal to the WAV points within the Cluster CB is likely to produce the most accurate result. Stated otherwise, "nearly orthogonal" refers to a relationship between each weighted average WAV point relative to the opposing axes (for example, the orthogonal relationship is between WAVx-axis and the opposing axes WAVy-axis, WAVz-axis). There are several methods to determine nearly orthogonal. One method selects the nearly orthogonal axis as having the smallest angular relationship compared to other angular relationships. For example, assume A=angle WAVx-axis vs. WAVy-axis; B=angle WAVx-axis vs. WAVz-axis, and C=WAVy-axis vs. WAVz-axis, and A<B and B<C and A<C, then angle A, WAVx-axis vs. WAVy-axis, has the smallest angular relationship compared to other angular relationships. Stated otherwise, WAVz-axis and WAVx-axis are opposing axes to WAVy-axis; WAVy-axis, WAVz-are opposing axes to WAVx-axis; and WAVy-axis and WAVx-axis are opposing axes to WAVz-axis. Another method to determine the nearest orthogonal axis is to determine the imaginary orthogonal projections from WAV to each opposing axis. If the numerical value of the orthogonal projections WAVx-axis compared to opposing WAVy-axis, WAVz-axis is LESS THAN orthogonal projections WAVy-axis compared to its opposing axes and is further LESS THAN orthogonal projections WAVz-axis compared to its opposing axes, then the shortest orthogonal projections points to the nearest orthogonal axis.

Also, the nearest orthogonal axis determination, based upon the smallest angular relationship of each WAV to the opposing axis may select nearly smallest angle wherein the nearly smallest angle is no more than 10 degrees larger than the smallest angular relationship.

In the highly unlikely event all three WAV values are equal, the subsampler defaults to any pre-set axis, for example x-axis because all orthogonal projection values to all axes are equal. The pre-set default is not relevant to the outcome because any one of the three WAV would adequately represent the best CB subsampled output SSO. If two of the three WAV values are equal, the subsampler outputs the WAV value which is the largest of WAVx-axis, WAVy-axis and WAVz-axis.

Once the SSO-WAV in Cluster CB is selected, the selected CB SSO-WAV from each Cluster must be normalized to all other CBs in the entire point cloud being subsampled. Hence, each CB SSO-WAV data in each CB must be re-calibrated to the entire array of CBs in the entire point cloud processed. The following example normalizes two CBs to each other. If SSO WAVx-axis is −28.6 units in CB 120 (CB 120 having an x-axis coordinate 20 of the 40 total CBs on the point cloud x-axis), and each CB has a maximum x-axis span of 100 units (from the CB origin or center-point, 50 units on either side of the x-axis), then the SSO or subsampled output for CB 120 is "point cloud normalized" to x-axis as −28.6 (to the left of the point cloud x-y origin). If the left-side adjacent CB 121 also has the −28.6 unit WAVx-axis, then the point cloud normalized SSO is −128.6 units for CB 121.

FIG. 7C shows formulas for estimating orthogonality of the axes. To estimate the orthogonality of the axes to the points within the Cluster CB, the maximum and minimum values of point coordinates along each axis are determined for each Cluster CB. The formulas are shown in FIG. 7C. The minimum axis value is subtracted from the maximum axis value to determine the range of points contained within the Cluster along the corresponding axis. As an example, for the x-axis, assume a data point 1, 2, 5, 6, 8, 9, and 11. The minimum is x=1 and the maximum is x=11 and the differential is 10. The range along each axis is then divided by the previously determined Spacing Value corresponding to the axis to determine a Relative Range value for each axis. The Spacing Value is the unitized size of the CB, explained later in connection with FIG. 5. Once a unitized grid is imposed on the data points to be subsampled, the Spacing Length on the respective x, y, z axis can be determined for the orthogonal algorithms.

The subsampler engine then prepares the data for filtering. Critical data is compiled to an array in preparation for filtering of the calculated weighted average points in order to determine the final subsampled points. In this manner, the selected WAV from each Cluster Bound (CB) must be normalized to the entire point cloud being subsampled. Hence, each CB WAV data in each CB must be re-calibrated to the entire array of CBs in the entire point cloud processed. The Sample Data Array (SDA) below computes this normalization. The SDA is created in which each element of the array is representative of a single Cluster. Within each element, values are stored as shown in Table 3 below.

TABLE 3

Sample Data Array

The center of the cluster in the X direction
The center of the cluster in the Y direction
The center of the cluster in the Z direction
The Relative Range of the cluster in the X direction - RRx
The Relative Range of the cluster in the Y direction - RRy
The Relative Range of the cluster in the Z direction - RRz
The weighted average point for the cluster in the X direction (WAVx-axis)
The weighted average point for the cluster in the Y direction (WAVy-axis)
The weighted average point for the cluster in the Z direction WAVz-axis)

This Sample Data Array ("SDA") array contains all of the data required to define the subsampled points "SSPt"—it is passed to the filtering logic in the following sections. Using the Sample Data Array above, the SSPt is the SSO described earlier.

Filtering could be (i) Filtering Points for Global Subsample or (ii) Filtering Points for Planar Subsample. As for filtering points for global subsample If the user initially selected "Process Entire Cloud" ("PEC") (explained later in connection with FIG. 5), then for each element in the Sample Data Array, a Subsample Point is determined for each CB. Each subsample point is an array consisting of a single element containing an x coordinate, a y coordinate, and z coordinate as: Sample Point=[x y z].

The filtering logic assigns an x, y, and z coordinate value for each element within the Sample Data Array, resulting in a single Subsample Point for each element (Cluster Bound or CB). For each element in the Sample Data Array, the minimum Relative Range is determined. The spatially Weighted Average WAV point corresponding to the axis with the minimum relative range is assigned as the corresponding coordinate in the Sample Point. The remaining two axis coordinates are defined as the center point of the cluster along those corresponding axes. The sample point for each Cluster is added to a Subsampled Point Array.

FIG. 7D shows the formulas for each element of the Sample Data Array. The sample point for each Cluster CB is added to the Subsampled Point Array ("SPA").

With respect to filtering points for planar subsample, the user has earlier selected "Process Custom Sections." For each element in the Sample Data Array a Subsample Point is determined. Each subsample point is an array consisting of a single element containing an x coordinate, a y coordinate, and z coordinate as shown above in the global subsample process.

The filtering logic assigns an x, y, and z coordinate value for each element within the Sample Data Array, resulting in a single Subsample Point for each element (SSO for each CB). For each CB element in the Sample Data Array, the minimum Relative Range is determined. For the user-selected axis (x, y, z) the corresponding Sample Point coordinate is set to the value of the Cluster Center along that axis. Then, it is determined which of the remaining two axes has the minimum Relative Range. For this minimum Relative Range axis, the corresponding Sample Point Coordinate is set to the corresponding weighted average point value WAV. The remaining axis is set to the corresponding Cluster Center along that axis. The sample point for each Cluster is added to a Subsampled Point Array.

Cleaning the subsampled array is also provided in this embodiment. The Subsampled Point Array is checked and cleaned prior to saving to the subsampled project. If any element of the array (each CB element representing a single WAV point of the subsample) is found to have a null value—that element is removed from the array. If a planar subsample was selected, the Subsampled Point Array is checked to verify that all points are located on planes corresponding to the specified user-input planar sample coordinates. Points which do not fall on these planes are removed from the array. The cleaned Subsample Data Array is written to a database table within the associated Project database. This database may be later accessed for creation of output files.

The max-min process may be better referred to as determining the spatial center of the scan data points. The spatial center max-min process discussed in connection with FIG. 7D could process (i) all x-axis data points for all the data points in the CB or (ii) all x-axis data points in the x-axis cylinder (FIG. 2A), assuming that the nearest orthogonal axis is z-axis. The spatial center max-min process is independently engaged for the x-axis and then the y-axis.

Another method for determining the SSO for a CB (rather than the midpoint of the non-selected axes (axes other than the nearly orthogonal axis) determined by the max-min formulas above (FIGS. 7C, 7D)) is to compute the center of mass of all the data points in the cylinder about the non-selected axes. Assuming the nearly orthogonal z-axis, the non-selected axes are x-axis and y-axis, and the cylinder of data points in FIG. 2A, 2B, defines the limited set of data in the CB, and the center of mass point ("CM") in the x-axis cylinder and the center of mass point in the y-axis cylinder are then used to locate the SSO of the CB (WAVz-axis, CMx-axis, CMy-axis). As a further alternative, the center of mass point ("CM2") in the x-axis direction for the entire CB and the center of mass point in the y-axis direction for the entire CB are used to locate the SSO of the CB (WAVz-axis, CM2x-axis, CM2y-axis). The selection of which methodology to use is related to the processing time and data storage facilities in the laptop or non-CADCAM loaded computer. For example, CM2 requires faster parallel processors and more data storage than the CM calculations and, in turn, the max-min formula processing is believed to require less speedy processors and data storage.

Rather than use a center of mass algorithm, a density algorithm can be employed.

In this embodiment of the invention, once one or multiple subsamples have been computed, they may be accessed and output as a useable file. To create an output file, the user selects one or multiple subsamples from the available project subsamples from a pull-down menu. The user then selects a filetype, location, and name for the output file. The Subsampled Point data from all of the selected project subsamples are read from the subsampling database and compiled into a single set of data. This data is then written to the user-defined file according to the filetype selected. Once a subsample file has been created, the user may import that file directly to 3D CAD software or other third-party software for analysis or further processing.

The following Software Step Table provides additional explanation of the process.

| Software Step Table |
|---|
| 1. # Get maximum and minimum dimensions along each axis<br># Determine total point cloud length along each axis<br>2. # Set up plane spacing<br>3. """Determines the coordinates for plane locations given a minimum coordinate, maximum coordinate, and spacing between planes"""<br>4. # Determine the bounds in each direction<br># Set coordinates and spacing<br># Create 'slices' in the main processing direction |

| Software Step Table |
|---|
| """Sets the bounds for a set of coordinates with a given spacing"""<br>5. When _sample_current_input( ) is called next, it will call_clean_input, which is what filters out the PCID that lies outside the min/max bounds.<br>6. # Create bins for splitting blocks<br># Group point data by blocks<br># Create lists of block points and bins<br># Convert to arrays and save as class variables<br>7. # Set up arrays for upper and lower boundaries of each block<br># Determine block midpoints<br># Determine max dimension of array<br># Create base array (per-block array)<br># # Create full array (per-point-per-block)<br># Create zeroing arrays for finding distances from block center<br># Calculate difference between each point and the center of the block xyzs = blocks<br># Determine point distances from block centerlines along each axis<br># Make appropriate delta zero for each axis in order to calculate distance from block center on that axis<br># Square all values to prepare for distance calculation<br># Take square root of the sum of squared values to calculate the distance for each point to the block center line<br># Make the distances arrays<br>8. # Determine multipliers for distances based on if the distance is greater or less than the search radius.<br># If the distance is less than the search radius, the point is kept and so the multiplier is set to 1<br># Otherwise, the multiplier is set to zero<br>9. # Multiply by inverse square of the distance (ensures nearer points are weighted more heavily)<br>10. # Apply weighting to block points<br># Multiply each block by its weighting values<br># Calculate sum for each set of block weights<br># Calculate sum for each set of weighting values<br># Calculate weighted average for each point in each direction<br>11.# ----- Prepare data metrics to be used for filtering points from subsample -----<br># Determine range of points relative to block width in each dimension<br>12. # Compile subsample data to a dataframe<br># remove zero relatives or remove "blocks" where the relative point density in all directions is zero (RRx = RRy = R).<br>13. Code eliminates/drops entire Clusters where the Relative Range of the cluster in the X, Y, and Z directions computed in Step 12 are all zero. Logically this step is happening in between steps 11 and 12. |

In summary regarding the subsampling outputs, once the subsampling is completed, the user can request the output file in any of the above-mentioned supporting file formats. The supported file formats are simple comma separated coordinate files that can be imported into most cad programs. Once the subsampling is completed, the user can request the output file in any of the above-mentioned supporting file formats. The supported file formats are simple comma separated coordinate files that can be imported into most cad programs. In a preferred embodiment, nearly all of the process steps operate on the input scan image data in parallel, that is, as a single process. Reduced file can be stored for BIM/Digital Twin or used for further processing such as 2D drawings, surface modeling/reverse engineering, taking measurements, interference checks, etc. The advantages of the pre-processing sampler include elimination or significant reduction of noise, the subsampling method produces a structured scan, reduces file size of the point cloud scan data, increases accuracy, and the pre-processing sampler can be run on a laptop or ordinary desktop.

FIGS. 6A through 6E illustrate (i) the Stanford Bunny point cloud using scan image data from the Stanford University Computer Graphics Laboratory and (ii) point processed images using the present inventive method. FIG. 6A shows the Stanford Bunny Point Cloud; FIG. 6B shows the Point Processed Bunny Global Subsample at Density 25; FIG. 6C shows the Point Processed Bunny Global Subsample at Density 35; FIG. 6D shows the Point Processed Bunny Planar Subsample at Density 25; and FIG. 6E shows the Point Processed Bunny Planar Subsample at Density 35.

FIGS. 8A, 8B, 8C and 8D graphically illustrate CAD outputs after pre-processing by the subsampler wherein the original point cloud as 0.7 GB and the pre-processed output was 0.7MB. A hull view, starboard side view, perspective view and sectional view are shown.

FIGS. 9A, 9B and 9C graphically illustrate a hull lines plan created from the pre-processing subsampler outputs useful for further processing 2D drawings, surface modeling/reverse engineering, taking measurements, and interference checks, etc. Starboard side view, hull view and bow sectional view are shown in this series of images.

FIG. 5 diagrammatically illustrates a general flow chart for the sub sampling process. The high-level processes include, in module 12, initialization of the subsampling system and process. In module 14, the user selects the density of the subsampling process. This selection is discussed in more detail below. In process module 16, the user selects the x, y, z axis orientation for the massive 3D data to be input into the subsampler. In module 18, the point cloud image scan data is input into the system. It should be noted that the sequence of modules 14, 16 and 18 may be changed to effect better user experience or processing efficiencies. In process module 20, the subsampler applies the coordinate system to 3D point data input in to the system, applies cubic segmentation to the point data to be processed and then applies the cylindrical limitation or the RSD process to cubic data, that is the image data points in the CB.

In one embodiment of the present invention, the preliminary processing of the point cloud data is discussed below. This preliminary processing occurs prior to the subsampling operations discussed above in connection with FIGS. 1-4B, 7A, 7B and 7C. The outputs for the subsampler are discussed above in connection with FIGS. 6A-E and 8A-9C. Other preliminary processing techniques and methods may be employed other than the following processes provided that CBs are developed and a consistent unitization and coordinate plan is imposed on the all CBs. On a high-level, the subsampling method converts 3D imaging scan data, having a multitudinous plurality of 3D data points, into a smaller density data set without engaging CAD programs. The method involves first, operationally, orientating the original point cloud to align a desired x, y and z coordinate system prior to importing the file into the pre-processing subsampler. The then-aligned point cloud is saved or exported into the subsampling engine in one of the supported coordinate file types: .csv, .txt, .pts, or .xyz. In one embodiment, the coordinates need to be "comma separated". The file is imported into pre-processing subsampler and the user defines a subsampling density and whether automatic or custom sample planes are to be used. In the subsampling algorithm, the point cloud is split into smaller volumes or Cluster Bounds (CB), with the sample planes centered within each Cluster Bound. Each Cluster Bound is thereafter analyzed individually.

Prior to running the subsampler engine discussed in connection with FIGS. 1-4B, 7A, 7B and 7C above, once point cloud files have been initially loaded, the user sets a "Density Setting" from a pull down menu, selecting at his or her option, Coarse, Medium, Fine pre-set process modules or "Custom". If Custom is selected, the user enters a numerical value in the Custom Density field.

The user then sets the "Process Type" dropdown to either "Process Entire Cloud" or "Process Custom Sections". If "Process Custom Sections" is selected, the user sets the "Select Process Axis" dropdown to 'X', 'Y', or 'Z', corresponding to the axis along which planar sets of points should be sampled. Once an axis is selected, the user enters a set of coordinates in the "Input Section Coordinates" field. Coordinates are entered as a comma-separated list of numerical values. The Custom Selection permits the user to select only a part of the point cloud scan image data to be processed by the subsampler.

Prior to subsampling (see FIG. 2A, et seq.), the subsampler engine determines the overall dimensions. The overall dimensions of the point cloud are obtained by querying the corresponding point cloud database to determine the maximum and minimum values along each axis (x, y, z). The dimensions are stored in the subsampler engine. For each axis, the point cloud length along that axis is determined by: Length=Max'm$_i$- Min'm$_i$.

The subsampler engine in this embodiment determines subdivision and sample plane spacing in the following manner. For each x, y, z direction, a "Spacing Value" is set based on the point cloud dimensions and user input. This is the same Spacing Value discussed above in the "estimating orthogonality of the axes." If the user selected 'Coarse', 'Medium', or 'Fine' density, the coordinate values along each axis are read and a distribution of the spacing between points is determined. The Spacing Value is then set to a confidence interval of the distribution, with successively smaller confidence interval progressing from 'Coarse' to 'Fine'. If a custom density value was entered, then the spacing for each axis is determined by: Spacing$_i$=Length$_i$ [divided by] Density.

The subsampler engine then sets the sample plane (SmPlane) coordinates. For each x, y, z direction, a list of numerical values is created, beginning with the corresponding axis minimum ("min") value and ending with the corresponding axis maximum value with each successive value being one axis Spacing Value ("space") greater than the prior value.

TABLE

| Sample Plane Equation |
| --- |
| SmPlanes = [min'm$_i$ , min'm$_i$ + space$_i$ , min'm$_i$ + 2 * space$_i$ , max'm$_i$] |

If the user selected Process Custom Sections, the planes for the user selected Process Axis are set to the user selected Section Coordinates. Unitization of the input and selected point cloud proceeds in a similar spacing as set forth above in connection with the pre-set selections (coarse, etc.).

The subsampler engine then sets bounds or data boundaries for the Cluster Bounds CB. For each x, y, z direction, a list of numerical values is created with values offset from the previously defined Sample Planes by one-half (½) of the corresponding axis spacing in either direction from the plane, such that the Cluster Bound coordinates fall midway between each successive Sample Plane. For example, the Sample Plane origins coincide with the centroid of the CB. See FIG. 1.

The subsampler engine then loads in the point cloud data. If the user selected "Process Entire Cloud" then the x, y, z coordinate data for the entire cloud is read from the input project database and loaded into the subsampler memory for processing. If the user selected "Process Custom Sections" then only the data within the user-selected bounds is loaded. This is the 3D image data to the subsampled. The to-be-sampled input data is loaded as an array of [x y z] values in to the subsampler engine, with each element of the array corresponding to a single point in the cloud. The points within this array are organized into an array of "Clusters"—such that all points within the Cluster lie between pairs of successive Cluster Bounds CBs along each axis. This is better represented by the following formula or pseudo-code.

Cluster Bound Code Table

Points in Cluster = array( [point a = [
$x\_bound_i < X << x\_bound_{i-1}$,
$y\_bound_j < Y << y\_bound_{j-1}$,
$z\_bound_k < Z << z\_bound_{k-1}$,
[point b, point c, . . .]

The CB Array is then an array in which each CB element of the array is a "Cluster" of points. Each CB is itself an array of [x y z] coordinates, with each data point element in the CB Cluster representing a single point within the point cloud. This is graphically represented by FIG. 1.

Thereafter, the subsampler engine determines the point distances from CB axes as explained earlier in connection with FIGS. 2A through 4B. For each CB in the cluster array (see Cluster Bound Table above), the cluster centerlines are x, y, z axes are aligned with the initially user-defined x, y, z axes for the entire point cloud. The origin of these CB axes is the CB centroid.

Although the subsample regions described above discuss cubic and rectangular regions, other subsample regions could be utilized. The processing time and data storage parameters are effected by other interlocking two-dimensional shapes or closed figures such as circles, squares, rectangles, rhombus, etc. and interlocking three-dimensional shapes cube, cuboid, cone, sphere and cylinder. The degree of interlock between these subsample regions effect the precision of the subsampling method herein. However, locating the centroid of such shapes, imposing a subsampling coordinate system thereon and applying the weighted average concepts herein may achieve the stated goal of pre-processing 3D scan data such that the SSO output can be used by non-CAD computer systems.

The claims appended hereto are meant to cover all modifications and changes within the scope and spirit of the present invention.

The invention claimed is:

1. A pre-processing subsampling method for converting 3D imaging scan data having a high-density data set of a plurality of 3D data points into a smaller density data set without engaging computer-aided design (CAD) programs comprising:
    selecting a subsampling density;
    selecting an x, y, z coordinate system for the subsampling process encompassing at least a portion of the 3D scan data;
    segmenting the portion of the 3D scan data into a plurality of cubic or rectangular subsample regions oriented with the selected x, y, z coordinate system wherein each respective subsample region has corresponding constituent 3D scan data points therein;
    applying a subsampling x, y, z coordinate system ("x, y, z SubSys") at a centroid of each subsample region;
    applying a corresponding cylindrical region coaxial with a respective x, y, z SubSys axis and defining a corresponding x-axis cylinder, y-axis cylinder and z-axis cylinder in the subsample region;
    constituent data points within each respective x-axis, y-axis and z-axis cylinder defined as subsampling C-points for the subsample region;
    obtaining the Euclidean distance (ED) of each C-point to the respective x, y, z SubSys axis (EDx1. . . n, EDy1. . . n, EDz1. . . n);
    computing a weighted value ("WV") of each corresponding C-point EDx1. . . n, EDy1. . . n, EDz1. . . n to its respective x, y, z SubSys axis such that C-points closer to the respective x, y, z SubSys axis are correlatively weighted greater than C-points farther away from the respective x, y, z SubSys axis;
    computing a weighted average ("WAV") of all C-points in the corresponding x-axis, y-axis and z-axis cylinder (WAVx-axis, WAVy-axis, WAVz-axis points) on a x, y, z SubSys axis basis;
    determining which corresponding x, y and z SubSys axis is nearly orthogonal to WAVx-axis, WAVy-axis, WAVz-axis points and identifying a WAV on the nearly orthogonal x, y, z axis as a single subsampled output (SSO) for the subsample region; and
    processing substantially in parallel the SSO point for each subsample region.

2. The pre-processing subsampling method as claimed in claim 1 including outputting all SSO points for all subsample regions to the CAD program.

3. The pre-processing subsampling method as claimed in claim 1 wherein computing the weighted value (WV) of each corresponding C-point EDx1. . . n, EDy1. . . n, EDz1. . . n includes obtaining the square of the inverse of ED for each corresponding C-point EDx1. . . EDxn, EDy1. . . EDyn, and EDz1. . . EDzn.

4. The pre-processing subsampling method as claimed in claim 1 wherein computing the weighted average WAVx-axis, WAVy-axis, and WAVz-axis includes, for each x-axis, y-axis and z-axis cylinder, calculating the sum of each C-point coordinate EDx1. . . EDxn, EDy1. . . EDyn, and EDz1. . . EDzn multiplied by its weighted value WVx1. . . WVxn, WVy1. . . WVyn, and WVz1. . . WVyn, and a resultant sum being divided by the sum of all the weighted values WVx1+. . . WVxn, WVy1+. . . WVyn, and WVz1+. . . WVzn.

5. The pre-processing subsampling method as claimed in claim 1 wherein selecting the subsampling density includes selecting one subsampling density of a plurality of subsampling densities including a coarse density, a medium density and a fine density, wherein the coarse density includes defining m units within a selected axial span encompassing a span of the plurality of 3D data points, wherein the medium density includes defining n units within the selected axial span encompassing the span of the plurality of 3D data points, wherein the fine density includes defining o units within the selected axial span encompassing the span of the plurality of 3D data points, and wherein m>n>o.

6. The pre-processing subsampling method as claimed in claim 5 wherein selecting the sub sampling density includes a user selection of sub sampling density.

7. The pre-processing subsampling method as claimed in claim 5 wherein each subsample region in the plurality of subsample regions includes a predefined number of units.

8. The pre-processing subsampling method as claimed in claim 7 wherein the SSO is further processed by determining either the center of mass or the spatial center of constituent data points on non-orthogonal x, y, z axes, whereby the SSO includes the nearly orthogonal WAVx-axis, WAVy-axis, or WAVz-axis and a center of mass coordinate or a spatial center coordinate from the constituent data points on non-orthogonal x, y, z axes.

9. The pre-processing subsampling method as claimed in claim 8 wherein applying the corresponding cylindrical region coaxial with the respective x, y, z SubSys axis to obtain the corresponding x-axis cylinder, the y-axis cylinder and the z-axis cylinder includes:
  providing a coarse cylindrical region having a radius of p units, providing a medium cylindrical region having a radius of q units, providing a fine cylindrical region having a radius of r units, wherein p>q>r; and
  selecting the coarse, medium, and fine cylindrical region based upon the coarse, medium or fine selection for the subsampling density;
  applying the selected coarse, medium, and fine cylindrical region while applying the corresponding cylindrical region coaxial to obtain the corresponding for the x-axis cylinder, the y-axis cylinder and the z-axis cylinder.

10. A pre-processing subsampling method for converting 3D imaging scan data having a high-density data set of a plurality of 3D data points into a smaller density data set without engaging computer-aided design (CAD) programs comprising:
  selecting a subsampling density;
  selecting an x, y, z coordinate system for the subsampling process encompassing at least a portion of the 3D scan data;
  segmenting the portion of the scan data into a plurality of cubic or rectangular subsample regions oriented with the selected x, y, z coordinate system wherein each respective subsample region has corresponding constituent 3D scan data points therein;
  applying a complementary subsampling x, y, z coordinate system ("x, y, z SubSys") at a centroid of each subsample region of the plurality of subsample regions;
  applying a corresponding cylindrical region coaxial with a respective x, y, z SubSys axis and defining a corresponding x-axis cylinder, y-axis cylinder and z-axis cylinder in the subsample region;
  constituent data points within each respective x-axis, y-axis and z-axis cylinders defined as subsampling C-points for the subsampling region;
  obtaining the Euclidean distance (ED) of each C-point to the respective x, y, z SubSys axis (EDx1...n, EDy1...n, EDz1...n);
  computing a weighted value ("WV") of each corresponding C-point EDx1...n, EDy1...n, EDz1...n to its respective x, y, z SubSys axis such that C-points closer to the respective x, y, z SubSys axis are correlatively weighted greater than C-points farther away from the respective x, y, z SubSys axis wherein:

$WVx1=(1/EDx1)*(1/EDx1)...WVxn=(1/EDxn)*(1/EDxn)$ $WVy1=(1/EDy1)*(1/EDy1)...WVyn=(1/EDyn)*(1/EDyn)$ $WVz1=(1/EDz1)*(1/EDz1)...WVzn=(1/EDzn)*(1/EDzn)$ computing a weighted average ("WAV") of all C-points in the corresponding x-axis, y-axis and z-axis cylinder (WAVx-axis, WAVy-axis, WAVz-axis points) wherein:

$WAVx\text{-axis}=((EDx1*WVx1)+(EDx2*WVx2)+...(EDxn*WVxn))\div(WVx1+WVx2+...WVxn)$ $WAVy\text{-axis}=((EDy1*WVy1)+(Edy2*WVy2)+...(EDyn*WVyn))\div(WVy1+WVy2+...WVyn)$ $WAVz\text{-axis}=((EDz1*WVz1)+(EDz2*WVz2)+...(EDzn*WVzn))\div(WVz1+WVz2+...WVzn);$ determining which corresponding x, y and z SubSys axis is nearly orthogonal to WAVx-axis, WAVy-axis, WAVz-axis points and identifying the respective WAV on the nearly orthogonal x, y, z axis as a single subsampled output (SSO) for the subsample region; and
  processing substantially in parallel the SSO point for each subsample region.

11. The pre-processing subsampling method as claimed in claim 10 including outputting all SSO points for all subsample regions to the computer-aided design program.

12. The pre-processing subsampling method as claimed in claim 10 wherein selecting the subsampling density includes selecting one subsampling density of a plurality of subsampling densities including a coarse density, a medium density and a fine density, wherein the coarse density includes defining m units within a selected axial span encompassing a span of the plurality of 3D data points, wherein the medium density includes defining n units within the selected axial span encompassing the span of the plurality of 3D data points, wherein the fine density includes defining o units within the selected axial span encompassing the span of the plurality of 3D data points, and wherein m>n>o.

13. The pre-processing subsampling method as claimed in claim 12 wherein selecting the subsampling density includes a user selection of subsampling density.

14. The pre-processing subsampling method as claimed in claim 12 wherein each subsample region in the plurality of subsample regions includes a predefined number of units.

15. The pre-processing subsampling method as claimed in claim 14 wherein the SSO is further processed to change the SSO coordinates for both non-orthogonal x, y, z axes based upon either a center of C-point mass or a spatial center of C-point in respective non-orthogonal x, y, z axes.

16. The pre-processing subsampling method as claimed in claim 15 wherein applying the corresponding cylindrical region coaxial with the respective x, y, z SubSys axis to obtain the corresponding x-axis cylinder, the y-axis cylinder and the z-axis cylinder includes:
  providing a coarse cylindrical region having a radius of p units, providing a medium cylindrical region having a radius of q units, providing a fine cylindrical region having a radius of r units, wherein p>q>r; and
  selecting the coarse, medium, and fine cylindrical region based upon the coarse, medium or fine selection for the subsampling density;
  applying the selected coarse, medium, and fine cylindrical region while applying the corresponding cylindrical region coaxial to obtain the corresponding for the x-axis cylinder, the y-axis cylinder and the z-axis cylinder.

17. A pre-processing subsampling method for converting 3D imaging scan data having a high-density data set of a plurality of 3D data points into a smaller density data set without engaging computer-aided design (CAD) programs comprising:
  selecting a subsampling density;
  selecting an x, y, z coordinate system for the subsampling process encompassing at least a portion of the 3D scan data;
  segmenting the portion of the scan data into a plurality of subsample regions oriented with the selected x, y, z coordinate system wherein each subsample regions has corresponding constituent 3D scan data points therein;
  applying a sub sampling x, y, z coordinate system ("x, y, z SubSys") at a centroid of each subsample region oriented with the selected x, y, z coordinate system;

applying a corresponding cylindrical region coaxial with a respective x, y, z SubSys axis thereby defining subsampling C-points consisting of constituent data points within respective corresponding x-axis, y-axis and z-axis cylinders;

obtaining the Euclidean distance (ED) of each C-point to its respective x, y, z SubSys axis (EDx1. . . n, EDy1. . . n, EDz1. . . n);

computing a weighted value ("WV") of each corresponding C-point EDx1. . . n, EDy1. . . n, EDz1. . . n to its respective x, y, z SubSys axis such that C-points closer to the respective x, y, z SubSys axis are correlatively weighted greater than C-points farther away from the respective x, y, z SubSys axis;

computing a weighted average ("WAV") of all C-points relative to its corresponding x-axis, y-axis and z-axis cylinder as WAVx-axis, WAVy-axis, WAVz-axis points;

determining which corresponding x, y and z SubSys axis is nearly orthogonal to WAVx-axis, WAVy-axis, WAVz-axis points and identifying the respective WAV on the nearly orthogonal x, y, z axis as a single subsampled output (SSO) for the subsample region, the SSO being one of the WAVx-axis, WAVy-axis, WAVz-axis points on the nearly orthogonal x, y, z axis; and processing substantially in parallel the SSO point for each subsample region.

18. The pre-processing subsampling method as claimed in claim 17 including outputting all SSO points for all subsample regions to the CAD program.

19. The pre-processing subsampling method as claimed in claim 17 wherein computing the weighted value (WV) of each corresponding C-point EDx1. . . n, EDy1. . . n, EDz1. . . n includes obtaining the square of the inverse of ED for each corresponding C-point EDx1. . . EDxn, EDy1. . . EDyn, and EDz1. . . EDzn.

20. The pre-processing subsampling method as claimed in claim 17 wherein computing the weighted average WAVx-axis, WAVy-axis, and WAVz-axis includes, for each x-axis, y-axis and z-axis cylinder, calculating the sum of each C-point coordinate EDx1. . .EDxn, EDy1. . .EDyn, and EDz1. . .EDzn multiplied by its weighted value WVx1. . . WVxn, WVy1 . . . WVyn, and WVz1. . . WVyn, and a resultant sum being divided by the sum of all the weighted values WVx1+. . . WVxn, WVy1+. . . WVyn, and WVz1+. . . WVzn.

* * * * *